US010763139B2

(12) United States Patent
Shindo

(10) Patent No.: US 10,763,139 B2
(45) Date of Patent: Sep. 1, 2020

(54) VACUUM TRANSFER MODULE AND SUBSTRATE PROCESSING APPARATUS

(71) Applicant: TOKYO ELECTRON LIMITED, Tokyo (JP)

(72) Inventor: Takehiro Shindo, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 60 days.

(21) Appl. No.: 15/987,519

(22) Filed: May 23, 2018

(65) Prior Publication Data

US 2018/0342409 A1    Nov. 29, 2018

(30) Foreign Application Priority Data

May 23, 2017  (JP) ................................. 2017-102016
Sep. 28, 2017  (JP) ................................. 2017-188627

(51) Int. Cl.
*H01L 21/677*  (2006.01)
*H01L 21/67*  (2006.01)
*H01L 21/68*  (2006.01)

(52) U.S. Cl.
CPC .. *H01L 21/67196* (2013.01); *H01L 21/67161* (2013.01); *H01L 21/67167* (2013.01); *H01L 21/67184* (2013.01); *H01L 21/67201* (2013.01); *H01L 21/67742* (2013.01); *H01L 21/67745* (2013.01); *H01L 21/67754* (2013.01); *H01L 21/67781* (2013.01); *H01L 21/681* (2013.01)

(58) Field of Classification Search
CPC ......... H01L 21/67196; H01L 21/67167; H01L 21/67754
See application file for complete search history.

(56) References Cited

U.S. PATENT DOCUMENTS

| 5,695,564 | A | 12/1997 | Imahashi | |
|---|---|---|---|---|
| 6,251,232 | B1 * | 6/2001 | Aruga | ..................... C23C 14/50 204/192.32 |
| 7,258,768 | B2 * | 8/2007 | Yamazaki | ............. C23C 14/568 118/719 |
| 8,092,139 | B2 * | 1/2012 | Watanabe | ......... H01L 21/67173 414/217 |
| 8,398,355 | B2 * | 3/2013 | Holtkamp | ......... H01L 21/67173 414/217 |

(Continued)

FOREIGN PATENT DOCUMENTS

| JP | 2001-509647 A | 7/2001 |
|---|---|---|
| JP | 2003-179120 | 6/2003 |

(Continued)

*Primary Examiner* — Jonathan Snelting
(74) *Attorney, Agent, or Firm* — Fenwick & West LLP

(57) ABSTRACT

A vacuum transfer module, to which a load-lock module and a plurality of processing modules for processing substrate in a vacuum atmosphere are connected, has therein a substrate transfer unit for transferring the substrate between the load-lock module and the plurality of processing modules. The vacuum transfer module includes: a housing in which a vacuum atmosphere is generated; and a plurality of adaptor attaching portions to which one of a first adaptor for connecting the load-lock module and a second adaptor for connecting the plurality of processing modules is attached, provided at a sidewall of the housing. The adaptor attaching portions are common for the first adaptor and the second adaptor.

15 Claims, 26 Drawing Sheets

(56) References Cited

U.S. PATENT DOCUMENTS

| | | | |
|---|---|---|---|
| 8,430,620 B1 * | 4/2013 | Blank | H01L 21/67742 414/217 |
| 9,002,514 B2 * | 4/2015 | Genetti | H01L 21/67196 700/248 |

FOREIGN PATENT DOCUMENTS

| | | |
|---|---|---|
| JP | 2008-300609 A | 12/2008 |
| JP | 2010-135495 A | 6/2010 |
| JP | 2013-171872 | 9/2013 |
| KR | 10-0172159 B1 | 3/1999 |

\* cited by examiner

VACUUM TRANSFER MODULE AND SUBSTRATE PROCESSING APPARATUS

CROSS-REFERENCE TO RELATED APPLICATIONS

This application claims priority to Japanese Patent Application Nos. 2017-102016 and 2017-188627 respectively filed on May 23 and Sep. 28, 2017, the entire contents of which are incorporated herein by reference.

FIELD OF THE INVENTION

The present disclosure relates to a technique for transferring a substrate in a vacuum atmosphere to process the substrate.

BACKGROUND OF THE INVENTION

In a semiconductor device manufacturing process, various processes such as etching, film formation and the like are performed in a vacuum atmosphere on a semiconductor wafer (hereinafter, referred to as "wafer") that a substrate. A substrate processing apparatus for performing such processes on the substrate includes a processing module for generating a vacuum atmosphere and performing gas processing on the wafer and a load-lock module whose inner pressure can be changed to transfer the wafer between carrier of the wafer in a normal pressure atmosphere and the processing module.

In order to improve productivity of a semiconductor product, it is required to improve a throughput of the substrate processing apparatus. Therefore, a vacuum transfer module for generating a vacuum atmosphere and transferring the wafer is provided between the load-lock module and the processing module. A plurality of processing modules may be connected to the vacuum transfer module. Japanese Patent Application Publication No. 2013-171872 discloses a substrate processing apparatus including the vacuum processing module and having an improved throughput by processing two wafers by a single processing module.

There are various sizes and shapes of a space where the substrate processing apparatus can be installed in a factory, and an increase in the number of processing modules may be required at any time. Therefore, in the substrate processing apparatus, in addition to the increase in the throughput, a degree of freedom in the arrangement of the load-lock module and the processing module needs to be increased. Japanese Patent Application Publication No. 2013-171872 does not disclose a measure for solving the problem of the degree of freedom in the arrangement. Japanese Patent Application Publication No. 2003-179120 discloses a substrate processing apparatus in which a desired number of processing modules and transfer modules can be connected throng relay unit. However, as the number of processing modules is increased, the number of transfer modules is also increased and, thus, it is difficult to sufficiently reduce the footprint of the apparatus.

SUMMARY OF THE INVENTION

In view of the above, the present disclosure provides a technique for increasing a degree of freedom in the arrangement of load-lock modules connected to a vacuum transfer module for transferring a substrate in a vacuum atmosphere and a plurality of processing modules for processing the substrate in the vacuum atmosphere.

In accordance with an aspect, there is provided a vacuum transfer module to which a load-lock module and a plurality of processing modules for processing a substrate in a vacuum atmosphere are connected, having therein a substrate transfer unit for transferring the substrate between the load-lock module and the plurality of processing modules. The vacuum transfer module includes: a housing in which a vacuum atmosphere is generated; and a plurality of adaptor attaching portions, to which one of a first adaptor for connecting the load-lock module and a second adaptor for connecting the plurality of processing modules is attached, provided at a sidewall of the housing, the plurality or adaptor attaching portions being common for the first adaptor and the second adaptor.

In accordance with another aspect, there is provided a substrate processing apparatus including: the vacuum transfer module described above; the load-lock module; the plurality of processing modules; the first adapter and the second adapter; and a loader module, to which a transfer container where the substrate is stored is mounted, configured to transfer the substrate between the transfer container and the load-lock module.

BRIEF DESCRIPTION OF THE DRAWINGS

The objects and features of the present disclosure will become apparent from the following description of embodiments, given in conjunction with the accompanying drawings, in which.

DETAILED DESCRIPTION OF THE EMBODIMENTS

First Embodiment

Figure 1:
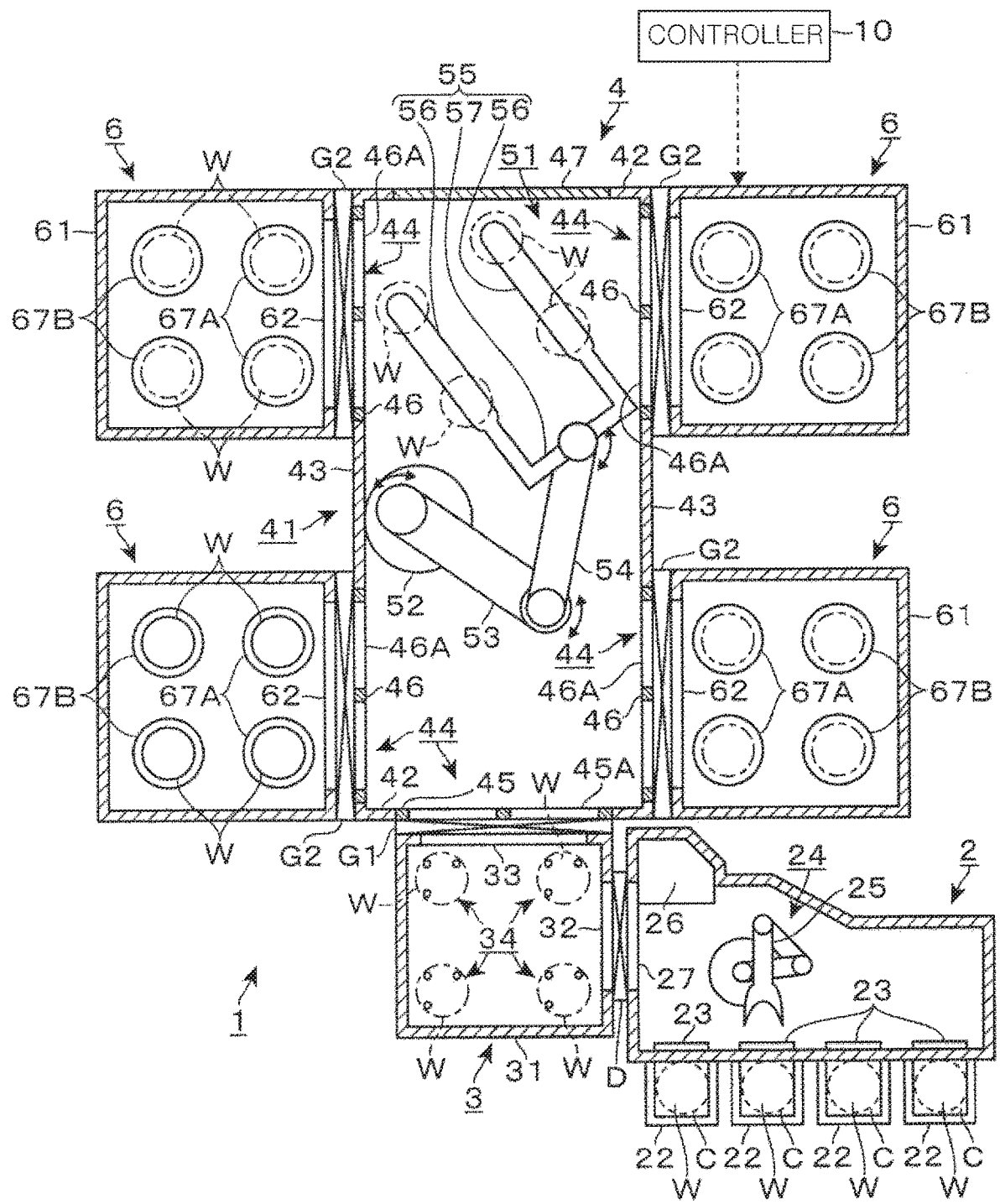
FIG. 1 is a horizontal top view showing a substrate processing apparatus according to a first embodiment.

A substrate processing apparatus 1 according to a first embodiment will be described with reference to the top view in FIG. 1. The substrate processing apparatus 1 includes a loader module 2, a load-lock module 3, a vacuum transfer module 4, and processing modules 6. The loader module 2 and the load-lock module 3 are connected to each other in a horizontal direction. The load-lock module 3 and the vacuum transfer module 4 are connected to each other in the horizontal direction. The vacuum transfer module 4 and the processing modules 6 are connected to each other in the horizontal direction. Since FIG. 1 is the top view, the load-lock module 3 and the vacuum transfer module 4 are arranged in the up down direction in the drawing.

The loader module 2 is used for taking, out a wafer W that is a circular substrate having a diameter of, e.g., 300 mm, from a carrier C that is a transfer container where the wafer W is stored in a normal pressure atmosphere. There are four processing modules 6, and each of the processing modules 6 perform film formation on four wafers W in a vacuum atmosphere by performing gas processing at the same time. The vacuum transfer module 4 forms a vacuum atmosphere and transfers the four wafers W at one time between the processing modules 6 and the load-lock module 3 in the vacuum atmosphere. There are two load-lock modules 3 (only one is shown in FIG. 1). In order to transfer the wafer W between the loader module 2 and the vacuum transfer module 4, and an atmosphere in the load-lock module 3 where the wafer W is positioned is switched between the normal pressure atmosphere and the vacuum atmosphere.

A notation D in the drawings denotes a door interposed between the loader module 2 and the load-lock module 3. The door opens and closes transfer ports for the wafer W which are provided at the respective modules. Notations G1 and G2 in the drawing denote gate valves interposed between the load-lock module 3 and the vacuum transfer module 4 and between the vacuum transfer module 4 and the processing modules 6, respectively. The gate valves open and close transfer ports for the wafer W which are provided at the modules connected to each other.

The gate valves G1 and G2 and the door D which are connected to the modules can be separated. In other words, the respective modules can be separated from each other. The vacuum transfer module 4 is configured to change positions for connecting the load-lock modules and positions for connecting the processing modules 6. In the first embodiment, an example of the arrangement of the load-lock modules 3 and the four processing modules 6 with respect to the vacuum transfer module is described. In a second and subsequent embodiments, other examples different from the arrangement example in the first embodiment will be described.

Hereinafter, the respective modules will be described. The loader module 2 includes a housing 21 and four carrier mounts 22 on which the carriers C are mounted at the outside of the housing 21. The inside of the housing 21 is set to a normal pressure atmosphere supplying a dry gas, e.g., dry air, or nitrogen gas. In other words, the inside of the housing 21 serves as a normal pressure transfer chamber. The four carrier mounts 22 are horizontally arranged linearly along a sidewall of the housing 21 convenience of explanation, the arrangement direction of the carrier mounts 22 is referred to as a right-left direction, and the carrier mounts 22 side and the housing 21 side are referred to as a front side and a rear side, respectively, in a horizontal direction perpendicular to the carrier mounts 22. Therefore, the sidewall of the housing 21 where the carrier mounts 22 are provided is referred to as a front wall of the housing 21. Further, unless otherwise specified, the right side and the left side when viewed from the front side to the rear side are referred to as a right side and a left side, respectively.

A reference numeral 23 in the drawings denotes doors that open and close opening (not shown) formed in the front wall of the housing 21 and also open and close the carriers C while holding lids of the carriers C. Four doors 23 are provided at positions corresponding to the carrier mounts 22. A transfer unit 24 for a wafer W, which is a multi-joint arm, is provided in the housing 21. An upper and a lower holding portion 25 forming a leading end portion of the transfer unit 24 are provided in a vertical direction with a gap therebetween such that the positions thereof are overlapped with each other when seen from the top. The wafer W is held on each of the holding portions 25. Therefore, the transfer unit 24 can transfer two wafers W at one time.

The housing 21 has a substantially rectangular shape elongated in the right-left direction when viewed from the top. A left rear portion protrudes toward a rear side, and an alignment unit 26 is provided at the left rear portion inside the housing 21. The alignment unit 26 includes a mounting portion for mounting and rotating the wafer W and an optical sensor to optically detect a notch that is a cutout at the edge of the wafer W and the center of the wafer W. There are provided an upper and a lower alignment unit 26 to correspond to the upper and the lower holding portion 25 of the transfer unit 24. A reference numeral 27 in the drawings denotes a transfer port for the wafer W which is opened on a left sidewall of the normal pressure transfer chamber. The transfer port is opened and closed by the door D.

Figure 2:
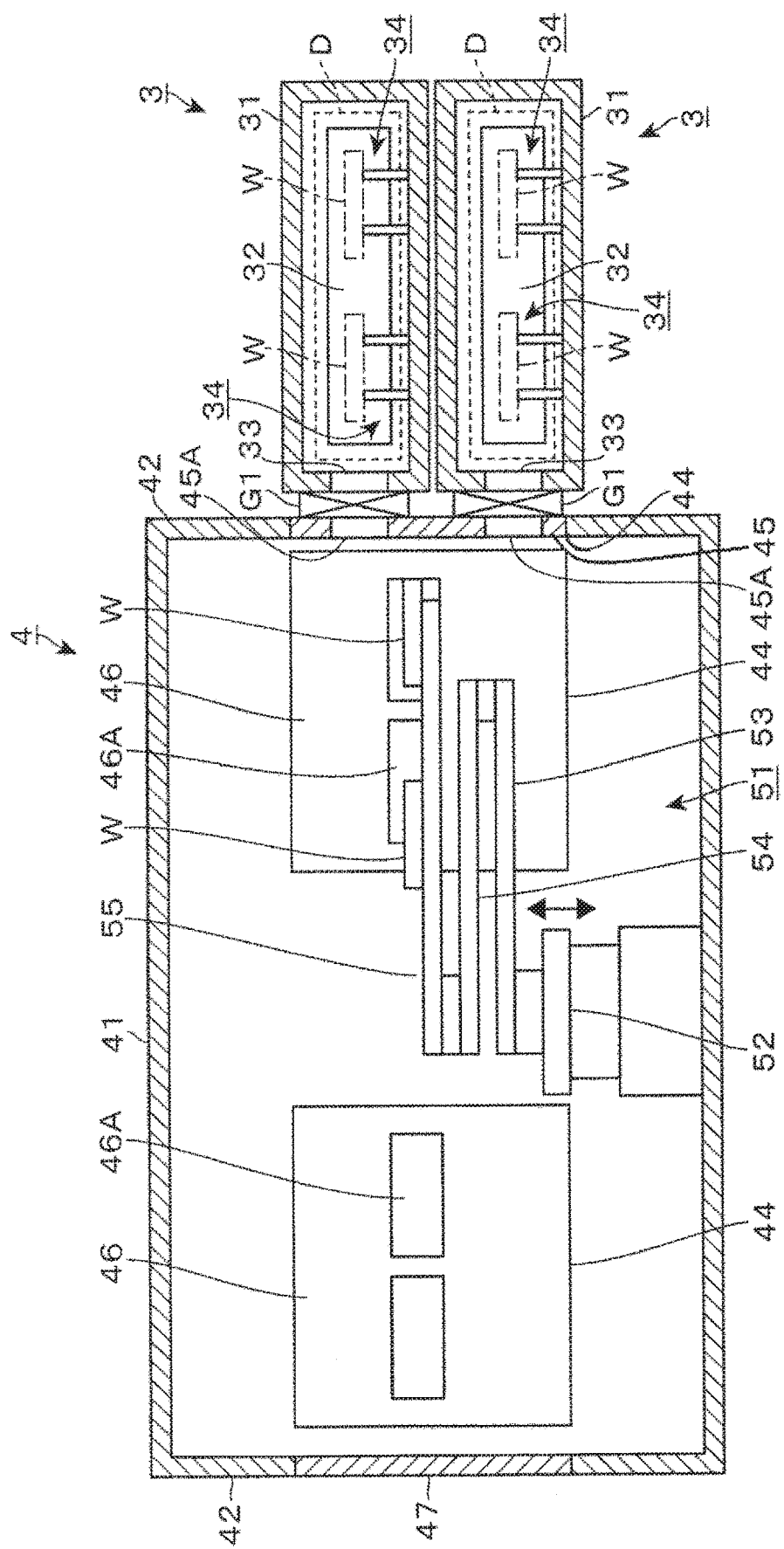
FIG. 2 is a vertical sectional view showing load-lock modules and a vacuum transfer module constituting the substrate processing apparatus.

Next, the load-lock modules 3 will be described with reference to FIGS. 1 and 2. As described above, there are two load-lock modules 3 having the same configuration. For example, one of the two load-lock modules 3 is used for transferring the wafer W to the vacuum transfer module 4 and the other one the two load-lock modules 3 used for transferring the wafer W to the loader module 2.

The two load-lock modules 3 are arranged vertically at the left side of the loader module 2 such that the positions thereof are overlapped with each other when seen from the top. Each of the load-lock modules 3 has a flat rectangular parallelepiped housing 31. The sidewalls of the housing 31 face the back-and-forth direction and the right-left direction. Reference numerals 32 and 33 in the drawing denote transfer ports for the wafers W which are opened right sidewall and a rear sidewall of the housing 31, respectively. The transfer ports 32 and 33 are opened and closed by the door D and the gate valve G1, respectively. Since the load-lock modules are provided in upper and lower two s ages, the gate valves G1 and the doors D are also provided in upper and lower two stages. In the upper load-lock module 3 and the lower load-lock module 3, the transfer ports 32 and 33 can be individually opened and closed, and the wafers W can be transferred independently.

A gas exhaust port and a gas supply port (both not shown) are provided on an inner wall of the housing 31. By evacuating a gas through the gas exhaust port, the inside of the housing 31 can be set to a vacuum atmosphere. By supplying a gas, e.g., nitrogen ($N_2$) gas, through the gas supply port, the inside of the housing 31 can be set to a normal pressure atmosphere. Therefore, the inside of the housing 31 serves as a load-lock chamber in which the normal pressure atmosphere and the vacuum atmosphere are switched. In the housing 31, four supporting portions 34 for supporting a backside of the wafer W are arranged in, e.g., a 2×2 matrix shape when viewed from the top. In this example, each of the supporting portions 34 has three (only two are shown in FIG. 2) vertical pins for supporting the backside of the wafer W.

In this example, height positions of the supporting portions 34 in the housing 31 are fixed, and the wafer W transferred between the supporting portions 34 and the transfer unit 24 of the loader module 2 and between the supporting portions 34 and a transfer unit 51 of the vacuum transfer module 4 which will be described later, by vertical movement of the transfer units 51 and 24. However, the wafer W may be transferred by vertical movement of the supporting portions 34. As long as the wafer W can be transferred, the supporting portions 34 may have, e.g., a plurality of horizontal rods without being limited to the above-described vertical pins.

Figure 3:
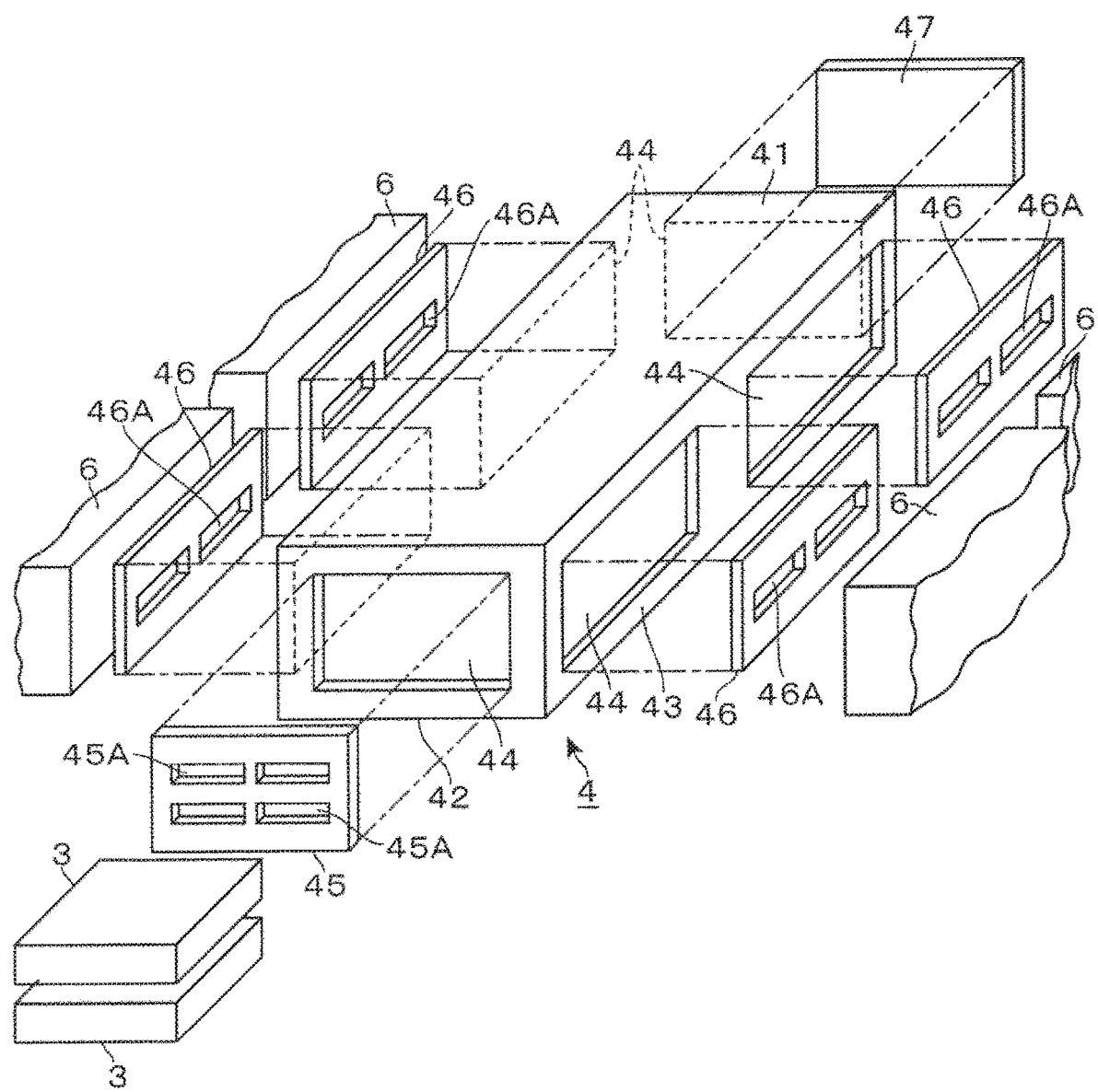
FIG. 3 is an exploded perspective view showing the vacuum transfer module.

Next, the vacuum transfer module 4 will be described with reference to FIGS. 1 to 3. In FIG. 3, other modules connected to the vacuum transfer module 4 also illustrated, the gate valves G1 and G2 interposed between the modules are not illustrated. The vacuum transfer module 4 is provided at the rear side of the load-lock modules 3. The vacuum transfer module 4 includes a housing 41 forming a vacuum transfer chamber. The housing 41 is formed in a rectangular parallelepiped shape and has a rectangular shape whose long side extends along the back-and-forth direction when seen from the top.

Among the four sidewalls of the housing 41, two sidewalls forming short sides of the rectangle are referred to as first sidewalls 42 and two sidewalls forming long sides of the rectangle are referred to as second sidewalls 42. A rectangular opening 44 is formed at the center of each first sidewall 42. Two rectangular openings 44 are formed on each second sidewall 43 along a longitudinal direction thereof. In a plane view, the sides of the openings 44 extend along the sides of the surfaces of the housings 41 on which the openings 44 are formed. The six openings 44 have the same shape and the same size and are provided at the same height. When the housing 41 is seen from the top, the arrangement of the openings 44 is symmetrical in the back-and-forth direction and in the right-left direction. Any one of interface plates 45 and 46 and a blind plate 47, which are rectangular plates having the same outer shape and the same size, can be attached to each opening 44 to block the corresponding opening 44. The interface plates 45 and 46 and the blind plate 47 are detachably attached to the openings 44.

Since the load-lock module 3 are provided in upper and lower two stages as described above, it is required to provide transfer ports for the wafers W at positions of the vacuum transfer module 4 which correspond to the height portions of the two load-lock modules 3. Through-holes defining transfer ports 45A corresponding to the respective load-lock modules 3 are formed in upper and lower two stages in the interface plate 45. The height dimension of the processing module 6 is greater than that of the load-lock module 3. Because of the limitation of the height of the module installation space, only one processing module 6 is provided in the vertical direction unlike the load-lock modules 3. Therefore, one transfer port for the wafer W is provided at the position of the vacuum transfer module 4 which corresponds to the height of the processing module 6, and one through-hole defining a transfer port 46A corresponding to the processing module 6 is formed in the interface plate 46.

In other words, the interface plate 45 forms a transfer path for the wafer W at a position of the vacuum transfer module 4 which corresponds to the height of the load-lock module 3 and serves as a first adaptor for the load-lock module 3 which connects the load-lock module 3 and the vacuum transfer module 4. In the first embodiment, the interface plate 45 is provided at the opening 44 of the first sidewall 42 on the front side to correspond to the arrangement of the load-lock modules 3. The two transfer ports 45A of the interface plate 45 are individually opened and closed by the two gate valves G1.

The interface plate 46 serves as a second adaptor for the processing module 6 and connects the processing module 6 and the vacuum transfer module 4 forming a transfer path for the wafer W at a position of the vacuum transfer module 4 which corresponds to the height of the processing module 6. In the first embodiment, since the processing modules 6 are connected to the front side and the rear side of each of the second sidewalls 43 of the vacuum transfer module 4, interface plate 46 is provided for each of the openings 44 formed at the second sidewalls 43. The transfer ports 46A of the interface plates 46 are opened and closed by the gate valves G2 provided for the processing modules 6, respectively.

Each of the openings 44 of the housing 41 serves as an adapter attaching portions which is common for the interface plates 45 and 46 and to which any one of the interface plates 45 and 46 serving as an adapter is attached. The transfer port 45A or 46A of the interface plate 45 or 46 shown in the drawings is partitioned in the horizontal direction by a partition provided at the center in the horizontal direction. However, they may not be partitioned. The blind plate 47 is a blocking member for blocking the opening 44 to airtightly seal the housing 41. Unlike the interface plates 45 and 46, the blind plate 47 does not have the transfer port for the wafer. In the first embodiment, the module is not connected to the rear side of the vacuum transfer module 4 and, thus, the blind plate 47 is attached to the first sidewall 42 on the rear side.

A gas exhaust port (not shown) is provided on the inner wall of the housing 41, and the inside f the hour 31 is evacuated to a vacuum atmosphere by exhausting a gas through the gas exhaust port. As shown in FIGS. 1 and 2, the transfer unit 51 for a wafer W, which is a multi-joint arm, is provided in the housing 41. The transfer unit 51 accesses each module connected to the vacuum transfer module and transfers the wafer W between the modules. The transfer unit 51 includes a base 52, a horizontally extending first arm 53, a horizontally extending second arm 54, and a wafer supporting unit 55. The base 52 is offset to the left side from a bottom central portion of the housing 41 and configured to be movable vertically. A base portion of the first arm 53 is provided on the base 52 and rotates about a vertical rotation axis on the base 52. A base portion of the second arm 54 is provided on the leading end portion of the first arm 53 and rotates about a vertical rotation axis on the leading end portion of the first arm 53. The wafer supporting unit 55 has two thin and long spatula-shaped supporting bodies 56 extending horizontally in parallel to each other and a connecting portion 57 for connecting base ends of these two supporting bodies 56. The connecting portion 57 extends in a horizontal direction perpendicular to the extension direction of the supporting bodies 56. A central portion in the longitudinal direction of the connecting portion 57 is provided on the leading end portion of the second arm 54 and rotates about a vertical rotation axis on the leading end portion of the second arm 54.

The wafers W are supported at the backsides thereof by a leading end portion and a base end of one supporting body 56 while being spaced apart from each other. Therefore, the wafer support unit 55 of the transfer unit 51 can transfer four wafers W at one time. Specifically, the supporting body 56 supports a diametrically extending region of the backside of the wafer W. A width of the supporting body 56 is smaller than the diameter of the wafer W, so that both edge portions of the wafers W supported by the supporting body 56 when viewed in the extension direction of the supporting body 56, are not overlapped with the supporting body 56. The central portion of the wafer W supported by the leading end side of the supporting body 56, is supported by the leading end of the supporting body 56 and the edge of the wafer W is positioned in a region extended from the leading end of the supporting body 56 in the extension direction.

In other words, the wafers W supported by the leading end portion and the base portion of the supporting bodies 56 have regions that are not overlapped with the supporting bodies 56. Therefore, the wafers W can be transferred between the wafer supporting unit 55 and the supporting portions 34 by vertically moving the wafer supporting unit 55 having the supporting bodies 56 with respect to the supporting portions 34 of the load-lock module 3. Also, the wafers W can be transferred between elevating pins 75 provided at mounting tables 67A and 67B of the processing module 6 which will be described later and the wafer supporting unit 55 by vertically moving the elevating pins 75. Since the wafer supporting unit 55 transfers the wafers W to the supporting portions 34 of the load-lock module 3 and the mounting tables 67A and 67B, the arrangement of the four wafers W supported by the wafer supporting unit 55 corresponds to the arrangement of the supporting portions 34 and the arrangement of the mounting tables 67A and 67B.

Next, the processing modules 6 will be described with reference to FIG. 4. Four processing modules 6 are film forming modules for forming a film on the wafer W by plasma ALD (Atomic Layer Deposition). The four processing modules 6 have the same configuration and can process the wafers W in parallel. Each of the processing modules 6 has a rectangular vacuum chamber (processing chamber) 61 when seen from the top (see FIG. 1) and a transfer port 62 for the wafer W which is opened and closed by the gate valve G2 is opened on the sidewall of the vacuum container 61. A reference numeral 63 in the drawing denotes a gas exhaust port that is opened on the bottom surface of the vacuum container 61 and connected to a vacuum pump 65 through a gas exhaust line 64. A reference numeral 66 in the drawing denotes a pressure control unit provided in the gas exhaust line 64. The pressure control unit 66 controls the amount of gas exhausted from the gas exhaust port 63 by the vacuum pump 65 so that an atmosphere in the vacuum container 61 becomes a vacuum atmosphere of a desired pressure.

In the vacuum container 61, the mounting tables 67A and the mounting tables 67B for mounting thereon the wafer W are arranged in two rows from the front side toward the rear side when seen from the transfer port 62. The rows of the mounting tables 67A and 67B are arranged side by side in the right-left direction when seen from the transfer port 62. Therefore, when seen from the top, four wafers W are mounted in a 2×2 matrix shape in the vacuum container 61. The mounting tables 67A and 67B have the same configuration and are formed in a flat circular shape. A reference numeral 70 in the drawing denotes heaters buried in the respective mounting tables 67A and 67B. The heater 70 heats the wafer W mounted on each of the mounting tables 67A and 67B to 300° C. to 450° C. The mounting tables 67A and 67B form electrodes and are connected to the ground potential via matching units (not shown).

A reference numeral 68 in the drawing denotes a column passing through the central portion of the bottom surface of the vacuum container 61. Four supporting arms 69 extend horizontally and radially from the upper end of the column and support the mounting tables 67A and 67B from the bottom side. The lower end of the column 68 is connected to an elevating mechanism 71 at the outside of the bottom portion of the vacuum container 61. The mounting tables 67A and 67B are vertically moved by the elevating mechanism 71 through the column 68 and the supporting arms 69 between positions indicated by solid lines and positions indicated by dashed dotted lines in FIG. 4. The positions indicated by the solid lines are processing positions for processing the wafers W. The positions indicated by the dashed dotted lines are transfer positions for transferring the wafers W between the mounting tables 67A and 67B and the transfer unit 51. A reference numeral 72 in the drawing denotes a seal member for maintaining the inside of the vacuum container 61 in an airtight state.

Figure 4:
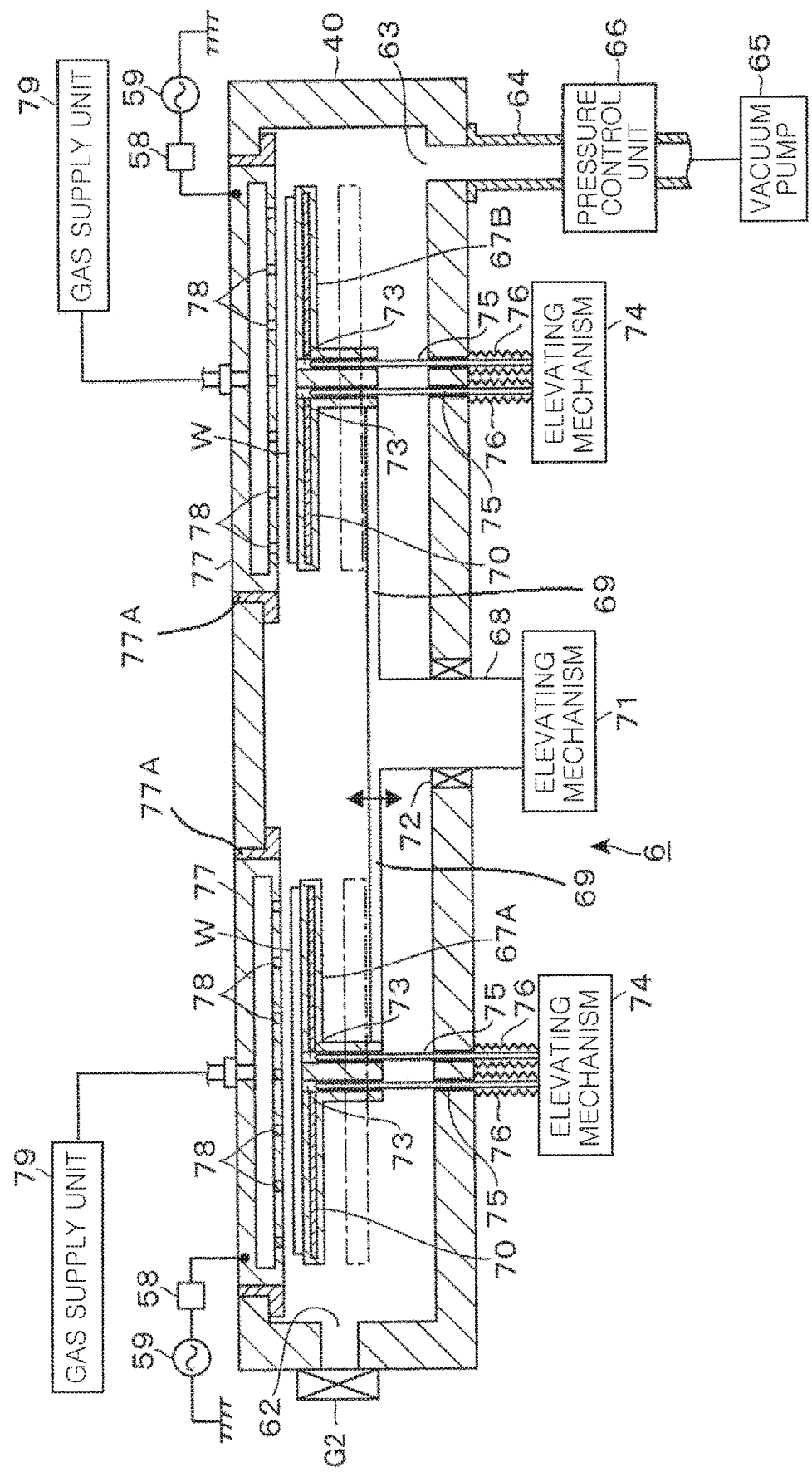
FIG. 4 is a vertical sectional view showing processing module constituting the substrate processing apparatus.

Three through-holes 73 are formed in each of the mounting tables 67A and 67B (only two are shown in FIG. 4). In each of the through-holes 73, an elevating pin 75 that is vertically moved to transfer the wafer W with respect to the transfer unit 51 is provided. A reference numeral 74 in the drawing denotes elevating mechanisms 74 for vertically moving the elevating pins 75. The elevating mechanisms 74 are provided at the outside of the bottom portion of the vacuum container 61. A reference numeral 76 in the drawing denotes bellows for ensuring airtightness in the vacuum container 61.

Gas shower heads 77 serving as electrodes are provided at the ceiling of the vacuum container 61 through insulating member 77A and positioned above the mounting tables 67A and 67B. The bottom surfaces of the gas shower heads 77 face the mounting tables 67A and 67B. A plurality of gas injection holes 78 is distributed on the bottom surfaces thereof. High frequency power supplies 59 are connected to the gas shower heads 77 via matching units 58, respectively. By supplying high frequency power to between each of the gas shower heads 77 and each of the mounting tables 67A and 67B, gases injected from the gas injection holes 78 to the mounting tables 67A and 67B are turned into plasma. In other words, the processing module 6 is configured as a parallel plate type plasma processing apparatus. A reference numeral 79 in the drawing denotes gas supply units. The gas supply units are configured to supply titanium tetrachloride ($TiCl_4$), hydrogen ($H_2$) gas, ammonia ($NH_3$) gas, argon (Ar) gas and nitrogen ($N_2$) gas independently to the gas shower heads 77. These gases are injected through the gas injection holes 78.

Next, the process of forming a film on the wafer W by the processing module 6 will be described. When the wafers W are mounted on the two mounting tables 67A and the two mounting tables 67B located at the transfer positions, the wafers W are heated by the heaters 70 and the mounting tables 67A and 67B are raised to the processing positions. Then, when $TiCl_4$ gas, Ar gas and $H_2$ gas are supplied as film forming gases from the gas shower heads 77, the high frequency power supplies 59 are switched to supply the high frequency powers to between each of the gas shower heads 77 and each of the mounting tables 67A and 67B and the gases supplied from the gas shower head 77 are converted into plasma. The TiCl$_4$ gas and the H$_2$ gas which have been turned into the plasma react with each other, thereby forming a layer of Ti (titanium) on the surfaces of the wafers W.

Next, the supply of the TiCl$_4$ gas, the Ar gas, and the H$_2$ gas from the gas shower heads 77 and the supply of the high frequency powers from the high frequency power supplies 59 are stopped. The vacuum container 61 is exhausted, and the TiCl$_4$ gas, the Ar gas and the H$_2$ gas are removed. Thereafter, NH$_3$ gas, Ar gas and H$_2$ gas are supplied from the gas shower heads 77 into the vacuum container 61, and the surface of the Ti layer is nitrided to form a TiN (titanium nitride) layer. Then, the formation of the Ti layer and the nitriding of the Ti layer are alternately repeated and, thus, the TiN layer is laminated to form a TiN film having a desired film thickness.

Referring back to FIG. 1, the substrate processing apparatus 1 includes a controller 10 including a computer. The controller 10 has a program. This program has a group of steps (commands) so that the operations such as the transfer of the wafer by the transfer unit, opening/closing of the door D and the gate valves G1 and G2, the control of the pressure in the processing modules 6, the start/stop of gas supply, the vertical movement of the elevating pins 75, the on/off of the high frequency power supplies 59 and the like controlled by outputting control signals to the respective modules and the wafer W can be processed in the substrate processing apparatus 1 as will be described later. This program is stored in a storage medium such as a hard disk, a compact disk, a DVD, memory card and the like, and is installed in the computer from the storage medium.

Next, the sequence of transferring and processing the wafer W in the substrate processing apparatus 1 will be described. The carrier C is mounted on the carrier mount 22 of the loader module 2, and two wafers W are transferred to the alignment unit 26 by the transfer unit 24. The transfer unit 24 receives the wafers W from the alignment unit 26 such that the wafers W are oriented in predetermined orientations and the centers of the wafers W are located at predetermined positions, and transfers the wafers W to two supporting portions 34 among the four supporting portions 34 in, e.g., the upper load-lock module 3 in a normal pressure atmosphere.

Thereafter, the transfer unit 24 transfers two wafers W from the carrier C to the alignment unit 26 and receives two wafers a from the alignment unit 26 such that the wafers W are oriented in predetermined orientations and the centers of the wafers W are located at predetermined positions. These two wafers W are transferred to two supporting portions 34 on which the wafers W are not supported in the upper load-lock module 3.

The transfer unit 24 is retreated from the upper load-lock module 3. When the inside of the upper load-lock module 3 becomes a vacuum atmosphere in a state where the door C and the gate valve G1 connected to the upper load-lock module 3 are closed, the gate valve G1 is opened. Then, the wafer supporting unit 55 of the transfer unit 51 enters the load-lock module 3, and four wafers W are transferred from the supporting portions 34 to the wafer supporting unit 55 at one time by upward movement of the wafer supporting unit 55.

Next, the gate valve G2 connected to the processing module 6 where no wafer W is being processed among the four processing modules 6 is opened and the wafer supporting unit 55 enters the corresponding processing module 6. The four wafers W supported by the wafer supporting unit 55 are transferred to the two mounting tables 67A and the two mounting tables 67B by the vertical movement of the lifting pins 75. Then, the wafer supporting unit 55 is retreated from the processing module 6 and the gate valve G2 is closed. After the film formation is performed and the TiN film is formed on the four wafers W as described above, the gate valve G2 is opened again and the four wafers W that have been subjected to the film formation are transferred to the wafer supporting unit 55 by the vertical movement of the elevating pins 75 in the processing module 6.

The wafer supporting unit 55 retreated from the processing module 6 and the gate valve G2 is closed. Then, the gate vale G1 connected to the lower load-lock module 3 in a vacuum atmosphere is opened. The wafer supporting unit enters the corresponding load-lock module and is lowered to transfer the four wafers N to the supporting portions 34. Then, the wafer supporting unit 55 is retreated from the load-lock module 3 and the gate valve G1 is closed. After the inside of the lower load-lock module 3 becomes a normal pressure atmosphere and the door D connected to the lower load-lock module 3 is opened, the wafers W are transferred from the supporting portions 34 to the carrier C by the transfer unit 24.

Figure 5:
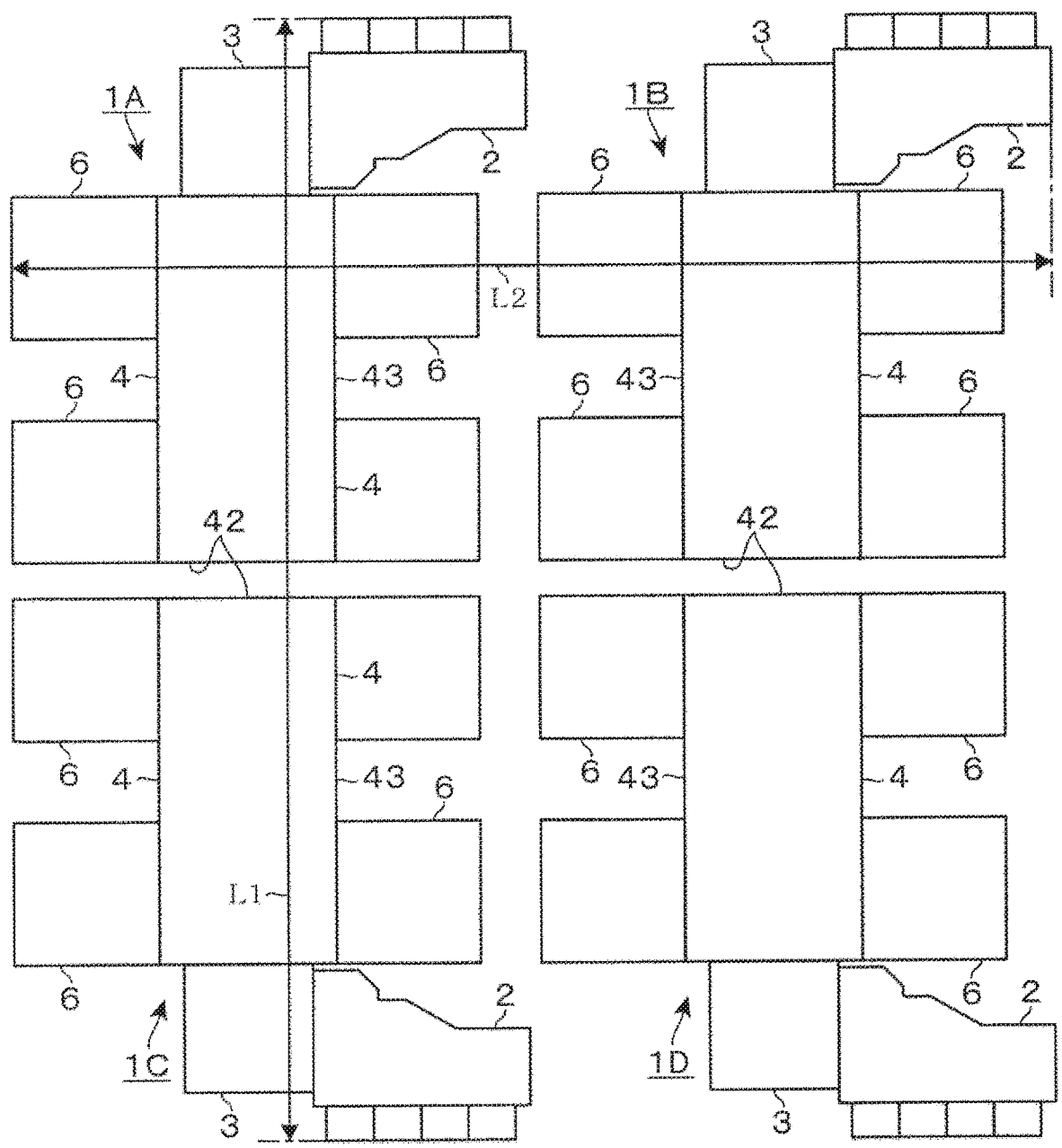
FIG. 5 is a top view showing an arrangement example of the substrate processing apparatus according to the first embodiment.

FIG. 5 shows an example in which four substrate processing apparatuses 1 are arranged in a 2×2 matrix shape when seen from the top. In order to distinguish the four substrate processing apparatuses 1, reference numerals 1A to 1D will be given to the substrate processing apparatuses. Specifically, reference numeral 1A denotes a substrate processing apparatus 1 positioned in the first row and the first column; reference numeral 1B denotes a substrate processing apparatus 1 positioned in the first row and the second column; reference numeral 1C denotes a substrate processing apparatus 1 positioned in the second row and the first column; and reference numeral 1D denotes a substrate processing apparatus 1 positioned in the second row and the second column. In the following embodiments as well, an example in which four substrate processing apparatuses other than these substrate processing apparatuses are arranged in a 2×2 matrix shape will be described. In that case as well, A to D will be given to the substrate processing apparatuses in the same manner.

The loader modules 2 of the substrate processing apparatuses 1A and 1B are connected to sides of the load-lock modules 3 which are opposite to the sides in the example shown in FIG. 1. The back-and-forth direction of the substrate processing apparatuses 1A to 1D coincides with the column direction of the matrix. The first sidewalls 42 of the vacuum transfer modules 4 having the blind plates 47 face each other between the substrate processing apparatuses 1A and 1C and between the substrate processing apparatuses 1B and 1D. Since the modules are not connected to these first sidewalls 42 facing each other, a gap between the substrate processing apparatuses 1 in the same column can be reduced. Therefore, it is possible to reduce a length occupied by two substrate processing apparatuses 1 in the same column in the matrix, i.e., a length L1 from the loader module 2 of one substrate processing apparatus 1 to the loader module 2 of the other substrate processing apparatus 1. Accordingly, the footprint of the four substrate processing apparatuses 1 can be reduced.

In the substrate processing apparatus 1, the load-lock module 3 and the loader module 2 are connected to each other in the right-left direction. Thus, the loader module 2 and the processing modules 6 form a row in the back-and-forth direction. With this arrangement, the length occupied by one substrate processing apparatus 1 is reduced compared to the case in which the loader module 2 is arranged in front of the load-lock module 3 and, also, a region facing both of the load-lock module 3 and the processing module 6 can be prevented from becoming a dead space. In other words, by connecting the load-lock module 3 and the loader module 2 in the right-left direction, the footprint of the substrate processing apparatus 1 is reduced.

When the substrate processing apparatuses 1A to 1D are arranged as shown in FIG. 5, the loader modules 2 of the substrate processing apparatuses 1A and 1C project toward the regions facing both of the load-lock modules 3 and the left front processing modules 6 of the substrate processing apparatuses 1B and 1D. In other words, even if the substrate processing apparatuses 1 in the same row the matrix are made to be close to each other, the loader module 2 of one substrate processing apparatus 1 does not interfere with any module of the other substrate processing apparatus 1. Therefore, by connecting the loader module 2 and the load-lock module 3 in the right-left direction, it is possible to reduce a width L2 occupied by two columns in the matrix. Accordingly, the footprint of the four substrate processing apparatuses 1 is reduced.

Second Embodiment

Figure 6:
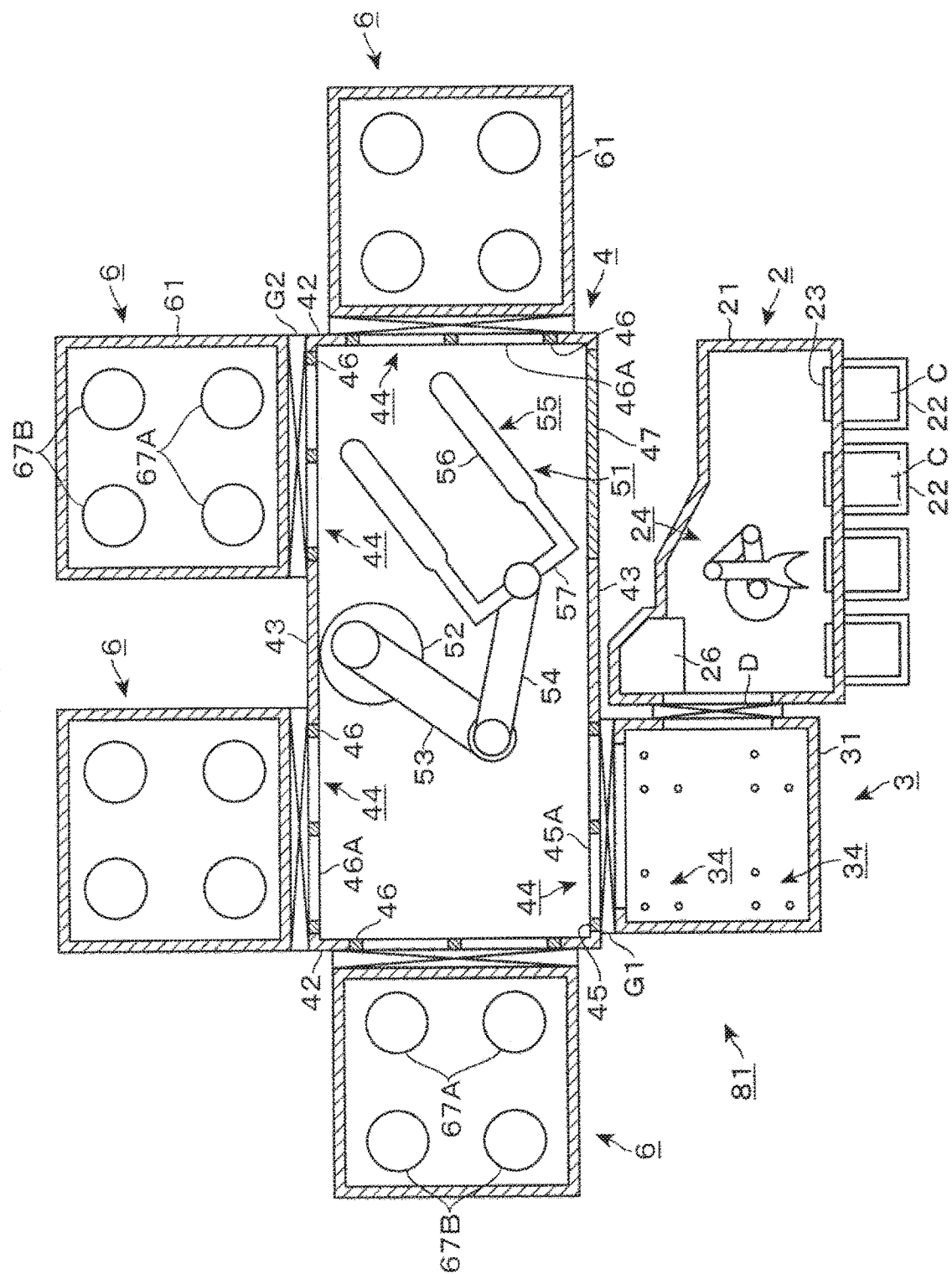
FIG. 6 is a horizontal toe view showing a substrate processing apparatus according to a second embodiment.

A substrate processing apparatus 81 according to a second embodiment will be described with reference to FIG. 6. Here, the differences between the substrate processing apparatus 81 and the substrate processing apparatus 1 will be described mainly. A vacuum transfer module 4 of the substrate processing apparatus 81 is provided such that long sides thereof extend along the right-left direction when seen from the top. A processing module 6 is attached to each of two first sidewalls 42 of the vacuum transfer module 4 through an interface plate 46. Two processing modules 6 are attached to second sidewall 43 on the rear side through interface plates 46. In the second sidewall 43 on the front side, a blind plate 47 is attached to a right opening 44, and a load-lock module 3 is attached to a left opening 44 through an interface plate 45.

Figure 7:
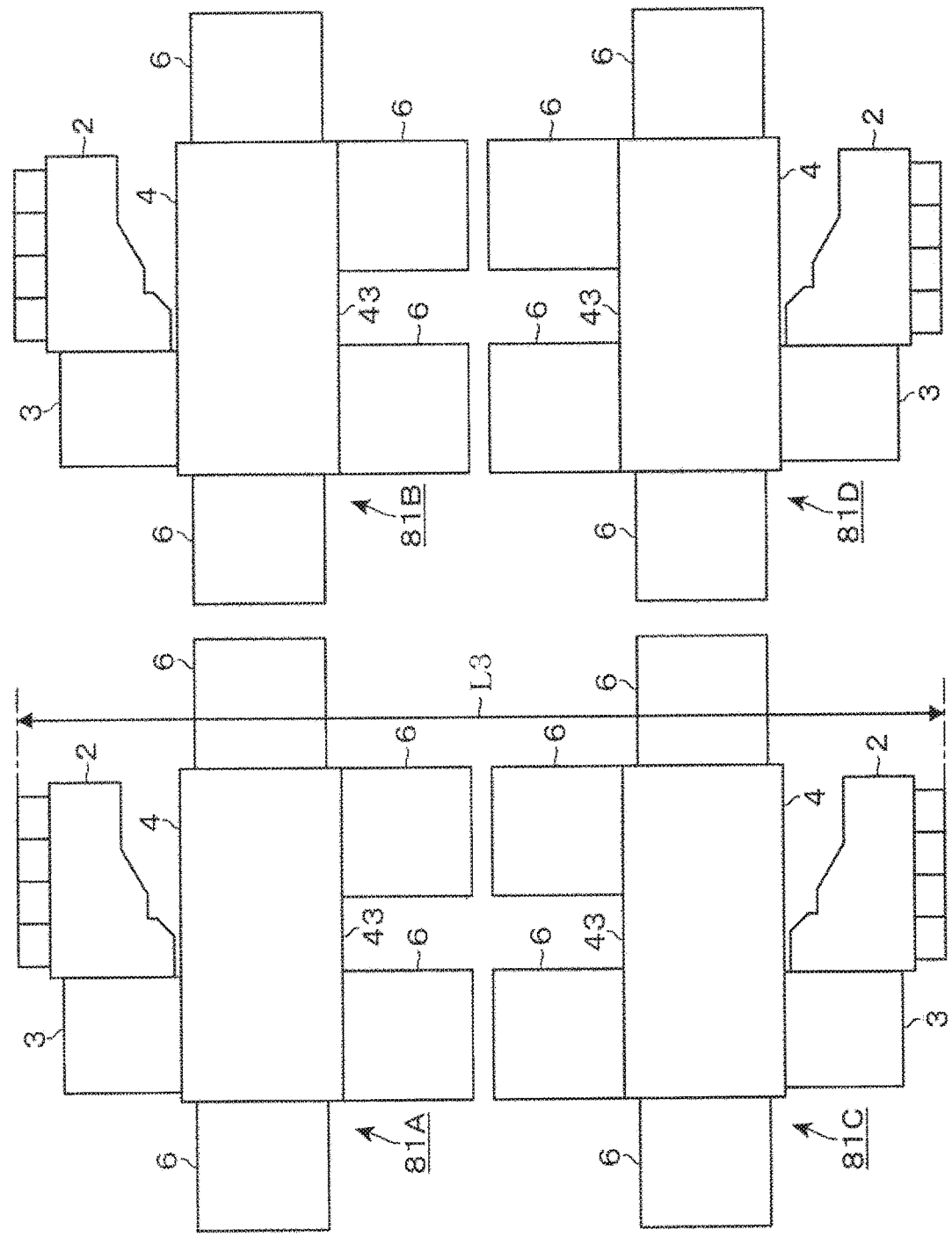
FIG. 7 is a top view showing an arrangement example of the substrate processing apparatus according to the second embodiment.

FIG. 7 snows an example in which four substrate processing apparatuses 81 are arranged in a 2×2 matrix shape as in the first embodiment. In two substrate processing apparatuses 81 in the same column, the second sidewalls 43 to which two processing, modules 6 are connected face each other. The loader modules 2 of the substrate processing apparatuses 81A and 81B are connected to sides of the load-lock modules 3 which are opposite to the sides in the example shown in FIG. 6. By connecting the load-lock module 3 and the processing modules 6 to the vacuum transfer module 4 as described above, a length L3 in the back-and-forth direction which is occupied by two substrate processing apparatuses 81 the same column can be smaller than the length L1 in the back-and-forth direction which occupied by two substrate processing apparatuses in the same column shown in FIG. 5.

The load-lock module 3 and the loader module 2 of the substrate processing apparatus 81 are also connected to each other in the right-left direction. Therefore, the loader module 2 is overlapped with the vacuum transfer module 4 when viewed in the back-and-forth direction. Accordingly, the length in the back-and-forth direction which is occupied by one substrate processing apparatus 81 is reduced compared to the case in which the loader module 2 is provided in front of the load-lock module 3, and the region facing both of the load-lock module 3 and the vacuum transfer module 4 is prevented from becoming a dead space. In other words, in the substrate processing apparatus 81 as well, the increase in the footprint of the apparatus is suppressed by connecting the load-lock module 3 and the loader module 2 to each other the right-left direction.

Third Embodiment

Figure 8:
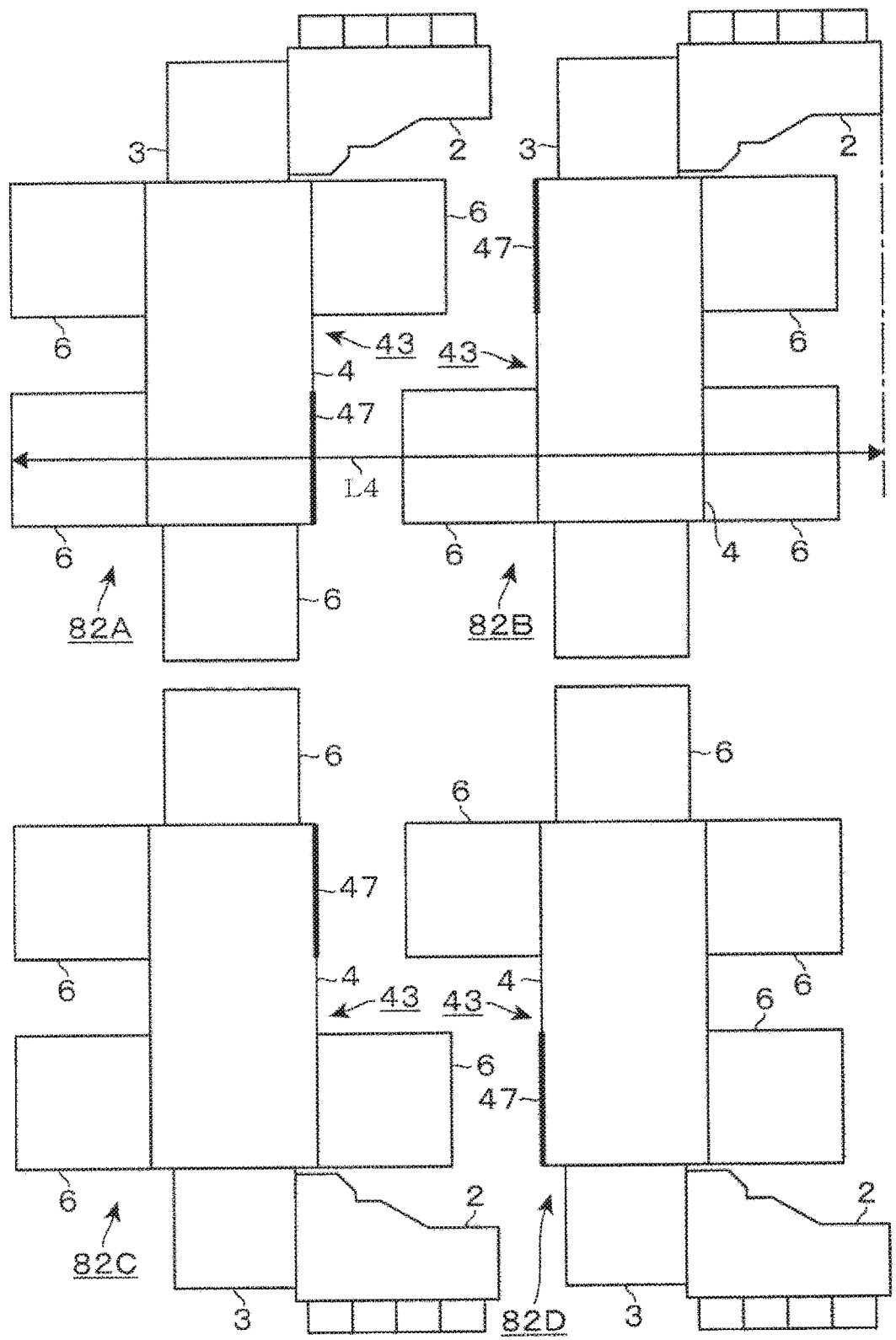
FIG. 8 is a top view showing an arrangement example of a substrate processing apparatus according to a third embodiment.

A substrate processing apparatus 82 according to a third embodiment will be described with reference to FIG. 8. Here, the differences between the substrate processing apparatus 82 and the substrate processing apparatus 1 will be described mainly. FIG. 8 shows an example in which the apparatuses are arranged in a 2×2 matrix shape as in the case of the substrate processing apparatuses 1 shown in FIG. 5 and the substrate processing apparatuses 81 shown in FIG. 7. Reference numerals 82A to 82D are given to the apparatuses in the above-described manner. In the vacuum transfer module 4 of the substrate processing apparatus 82, the processing module 6 also connected to the first sidewall 42 on the rear side. Further, one processing module 6 and a blind plate 47 are attached to one of the two second sidewalls 43.

In the substrate processing apparatuses 82A and 82B, the second sidewalls 43 to each of which one processing module 6 is connected face each other, and the positions of the second sidewalls 42 to which the processing modules 6 are connected are different in the back-and-forth direction between the substrate processing apparatuses 82A and 82B. In the same manner, the substrate processing apparatuses 82C and 82D, the second sidewalls 43 to each of which one processing module 6 connected face each other, and the positions of the second walls 42 to which the processing modules 6 are connected are different in the back-and-forth direction between the substrate processing apparatuses 82A and 82B. By connecting the modules as described above, it is possible to make the column of the substrate processing apparatuses 82A and 82C close to the column of the substrate processing apparatuses 82B and 82D so that the four processing modules 6 provided on the second sidewalls 43 to which one processing module 6 is connected in the substrate processing apparatuses 82A to 82D are partially overlapped when seen in the back-and-forth direction, and also possible to reduce a width L4 occupied by these two columns.

As clearly described in the first to third embodiments, in the vacuum transfer module 4, the load-lock module 3 and the processing modules 6 can be selectively attached to the openings 44 provided at the sidewalls of the housing 41 and, thus, the degree of freedom in the arrangement of the load-lock module 3 and the processing modules 6 increased. Therefore, the selectivity of the planar shape of the substrate processing apparatus is increased, and the substrate processing apparatus can be configured by connecting the load-lock modules 3 and the processing modules 6 to the vacuum transfer chamber 4 based on the size of the space in which the substrate processing apparatus is installed, the shape of the space, the transfer path of the transfer mechanism for transferring the carrier C to the substrate processing apparatus, and the like. Accordingly, it is possible to prevent the number of processing modules 6 or the number of substrate processing apparatuses from being limited by restrictions in the installation space of the apparatus, the transfer path of the transfer mechanism or the like. As a result, the productivity of the semiconductor product can be increased.

The housing 41 of the vacuum trans tier module 4 has a rectangular shape when seen from the top. The openings 44 are formed at the first sidewalls 42 and the second sidewalls 43. The number of openings 44 formed at the second sidewalls 43 forming the long sides of the rectangle is greater than the number of openings 44 formed the first sidewalls 42 forming the short sides of the rectangle. With this configuration, the number of openings 44 in the housing 41 can be increased, and the length of the substrate processing apparatus in the back-and-for direction can be considerably increased by changing the direction of the housing 41. In other words, the vacuum transfer module 4 is configured so that the selectivity of the planar shape of the substrate processing apparatus can be further increased.

In each of the substrate processing apparatuses 1, 81, and 82, the transfer unit 51 of the vacuum transfer module 4 transfers four wafers W at one time to a plurality of processing modules 6 connected to the vacuum transfer module 4 and, thus, a high throughput can be obtained. Further, in each of the processing modules 6, the four wafers W are processed at one time and, thus, a higher throughput can be obtained.

Fourth Embodiment

Figure 9:
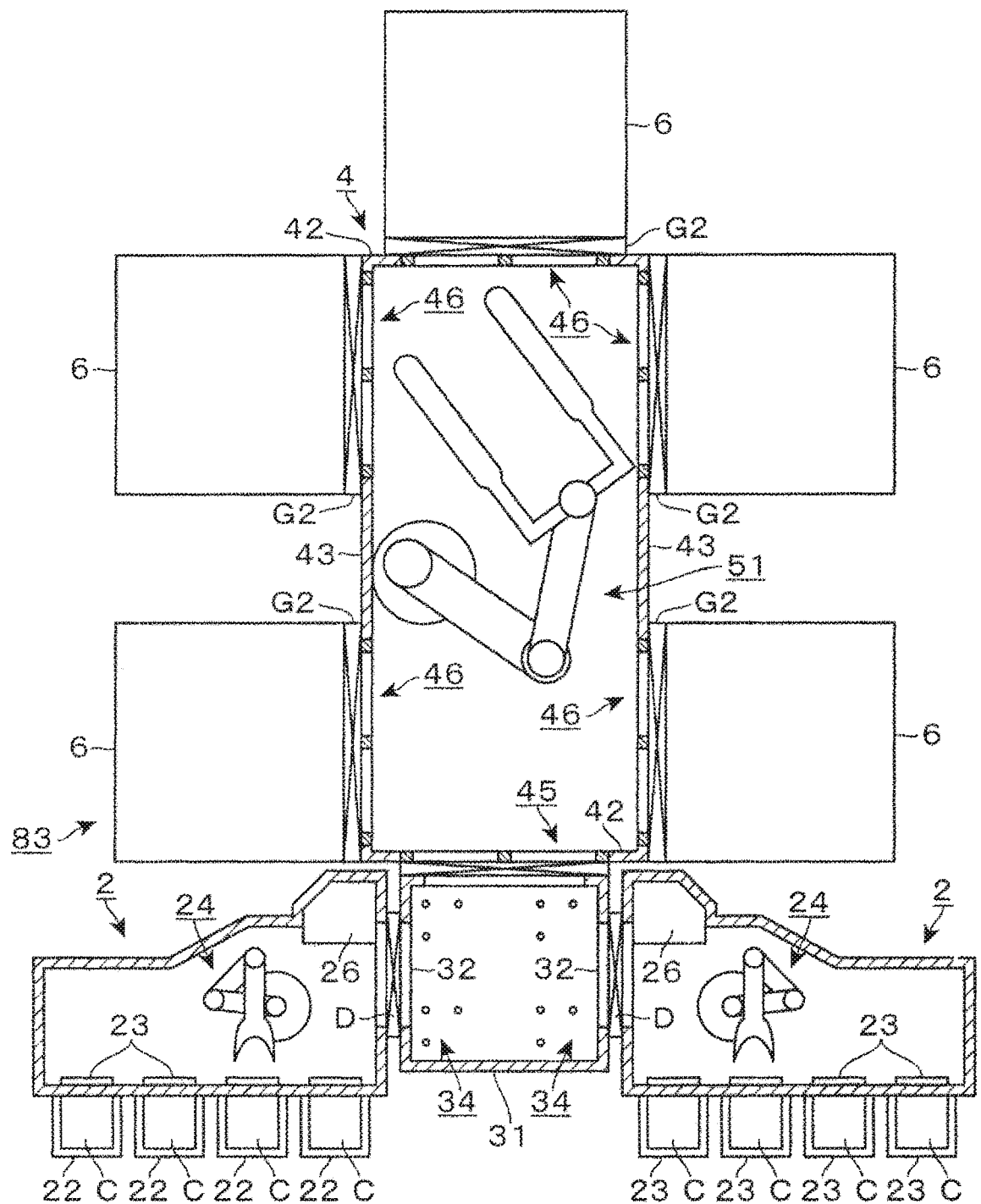
FIG. 9 is a horizontal top view showing a substrate processing apparatus according to a fourth embodiment.

Next, a substrate processing apparatus 83 according to a fourth embodiment will be described with reference to FIG. 9. Here, the differences between the substrate processing apparatus 83 and the substrate processing apparatus be described mainly. A processing module 6, instead of a blind plate 47, is connected to the first sidewall 42 on the rear side of the vacuum transfer module 4 of the substrate processing apparatus 83. The substrate processing apparatus 83 includes five processing modules 6. A loader module 2 is connected to both sides of the load-lock module 3 in the right-left direction through respective doors D. Therefore, the substrate processing apparatus 83 includes two loader modules 2. The loader module 2 provided at the left side of the load-lock module 3 is configured to be mirror-symmetrical with the loader module 2 provided at the right side of the loader module when seen from top. A transfer port 32 is formed at a right sidewall and a left sidewall of the load-lock module 3 to correspond to the two loader modules 2.

In this substrate processing apparatus 83, since two loader modules are provided, loading and unloading of the wafers W to and from the load-lock module 3 is quickly performed. Further, since five processing modules 6 are provided, the number of wafers W that can be processed at one time is greater than that in the substrate processing apparatus 1. Therefore, a throughput in the substrate processing apparatus 83 can be further increased compared to that in the substrate processing apparatus 1.

Fifth Embodiment

Figure 10:
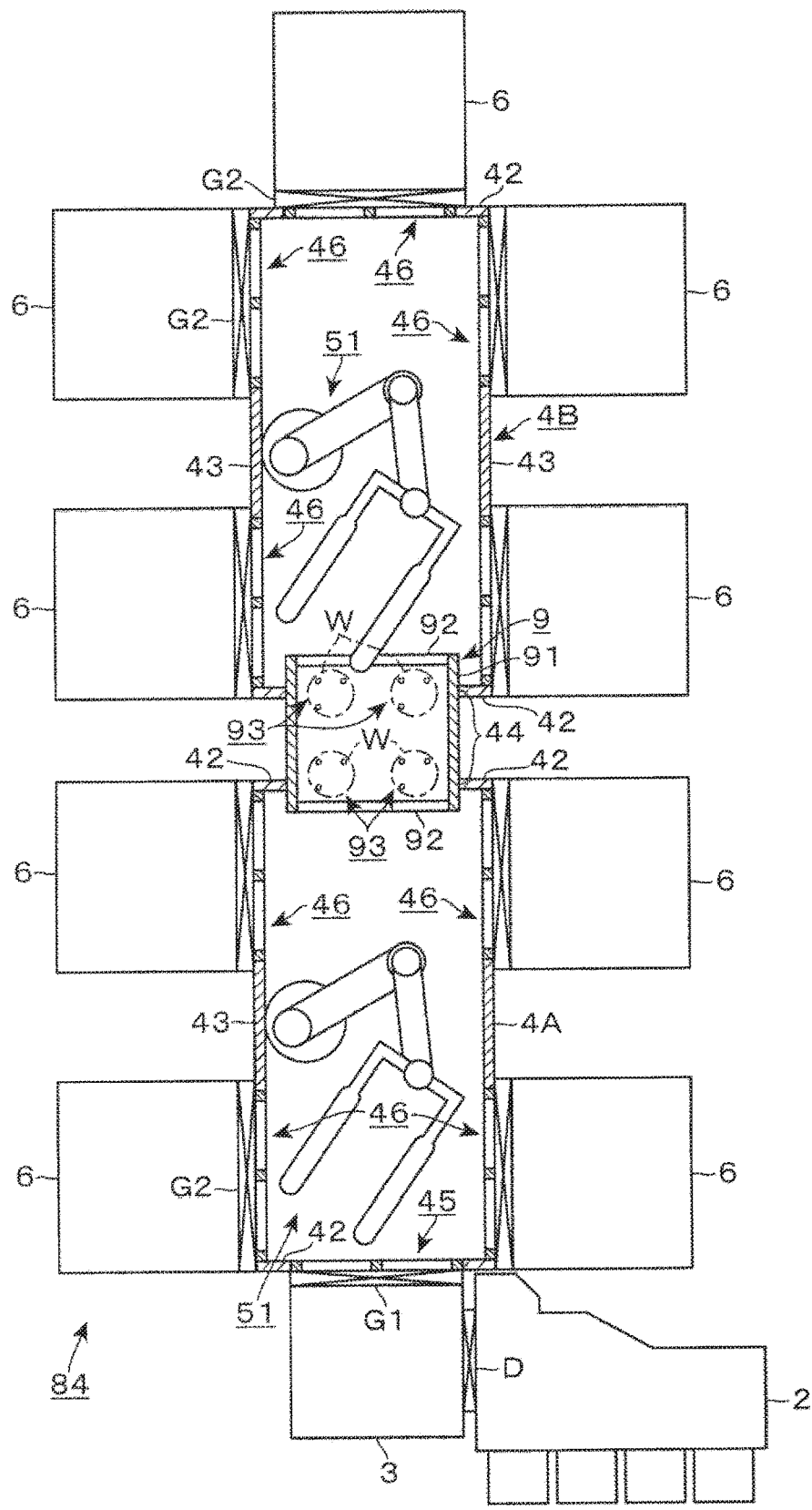
FIG. 10 is a horizontal top view showing a substrate processing apparatus according to a fifth embodiment.

A substrate processing apparatus 84 according to a fifth embodiment will be described with reference to FIG. 10. The substrate processing apparatus 84 includes two vacuum transfer modules 4 and a mounting module 9 for connecting the two vacuum transfer modules 4. The mounting module 9 mounts thereon wafers W to be transferred between itself and the vacuum transfer modules 4. When seen from the top, the vacuum transfer modules 4 are arranged side by side in the back-and-forth direction so that the long sides of the rectangular shape of the vacuum transfer modules 4 extend along the back-and-forth direction. For convenience of explanation, a reference numeral 4A denotes a vacuum transfer module on the front side and a reference numeral 4B denotes a vacuum n transfer module on the rear side. The load-lock module 3 and the processing modules 6 are attached to the vacuum transfer module 4A, as in the case of the vacuum transfer module 4 of the first embodiment. However, unlike the first embodiment, a blind plate 47 is not attached to the first sidewall 42 on the rear side of the vacuum transfer module 4A. In the vacuum transfer module 4B, a processing module 6 is attached to the first sidewall 42 on the rear side and two processing modules 6 are attached to each of two second sidewalls 43.

Hereinafter, the mounting module 9 will be described. The mounting module 9 includes a housing 91 having a rectangular shape when seen from the top. By fitting the housing 91 into the opening 44 of the vacuum transfer module 4, the mounting module 9 and the vacuum transfer module 4 are connected. The mounting module 9 and the vacuum transfer module 4 are detachable from each other. A transfer port 92 for the wafer W is formed through two sidewalls facing each other among four sidewalls of the housing 91. Four mounting portions 93 for mounting thereon wafers W are provided in the housing 91.

In the case of transferring wafers W between the transfer unit 51 of the vacuum transfer module 4A and the transfer unit 51 of the vacuum transfer module 4B, four wafers W are transferred at one time from one of the transfer units 51 to the four mounting portions 93, and the other transfer unit 51 receives the four wafers W from the four mounting portions 93. Each of the mounting portions 93 is provided with, e.g., three vertical pins for supporting the backside of the wafer W, similarly to the supporting portions 34 of the load-lock module 3. However, it is not limited thereto as long as the wafers W can be transferred to the transfer unit 51.

The mounting module 9 is attached to the first sidewall 42 on the rear side of the vacuum transfer module 4A and the first sidewall 42 on the front side of the vacuum transfer module 4B so that the transfer ports 92 are opened into the housings 41 of the vacuum transfer modules 4A and 4B. The wafer W transferred from the load-lock module 3 is transferred to any one of nine processing modules 6 connected to the vacuum transfer modules 4A and 4B to be processed therein.

In this substrate processing apparatus 84, since the vacuum transfer modules 4A and 4B are connected to each other, it is possible to transfer the wafers W to the nine processing modules 6 connected to the vacuum transfer modules 4A and 4B from the leader module 2 and the load-lock module 3 which are common for the vacuum transfer modules 4A and 4B. Therefore, the number of the processing modules 6 with respect to the number of the loader module 2 and the load-lock module 3 can be i-creased. Accordingly, the throughput can be increased while reducing the footprint of the apparatus.

Sixth Embodiment

Figure 11:
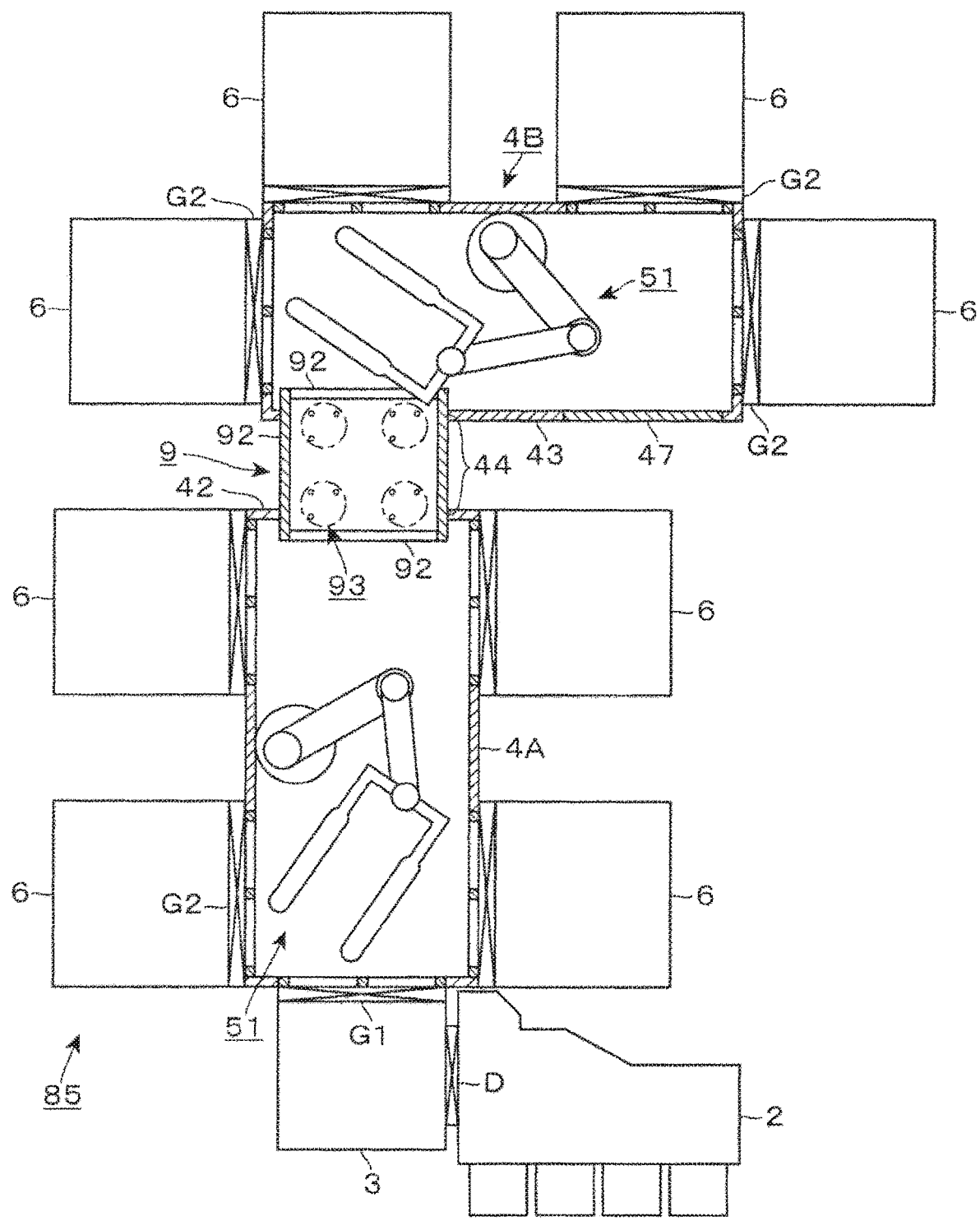
FIG. 11 a horizontal top view showing a substrate processing apparatus according to a sixth embodiment.

A substrate processing apparatus 85 according to a sixth embodiment will be described with reference to FIG. 11. Here, the differences between the substrate processing apparatus 85 and the substrate processing apparatus 84 will be described mainly. In this substrate processing apparatus 85 as well, vacuum transfer modules 4A and 4B are connected through a mounting module 9. Various modules are connected to the vacuum transfer module 4A of the substrate processing apparatus 85, as in the case of the vacuum transfer module 4A of the vacuum processing apparatus 84. In the vacuum transfer module 4B, long sides of the rectangular shape when seen from the are arranged along the right-left direction as in the case of the vacuum transfer module 4 of the substrate processing apparatus 81 shown in FIG. 6. The positions of the vacuum transfer module 4B to which the processing modules 6 and the blind plate 47 are connected are the same as those of the vacuum transfer module to which the processing modules 6 and the blind plate 47 are connected. The mounting module 9 is fitted to an opening 44 of a first sidewall 42 on the rear side of the vacuum transfer module 4A and an opening 44 of a second sidewall 43 on the front side of the vacuum transfer module 4B.

In this substrate processing apparatus 85, the number of the processing modules 6 with respect to the number of the loader modules 2 and the load-lock module 3 can be increased, as in the case the substrate processing apparatus 84. Further, since the vacuum transfer modules 4A and 4B are connected to each other through the mounting module 9 in the above-described direction, it is possible to reduce the width in the back-and-forth direction of the apparatus compared to that in the substrate processing apparatus 84. Accordingly the footprint of the apparatus can be reduced.

Figure 12:
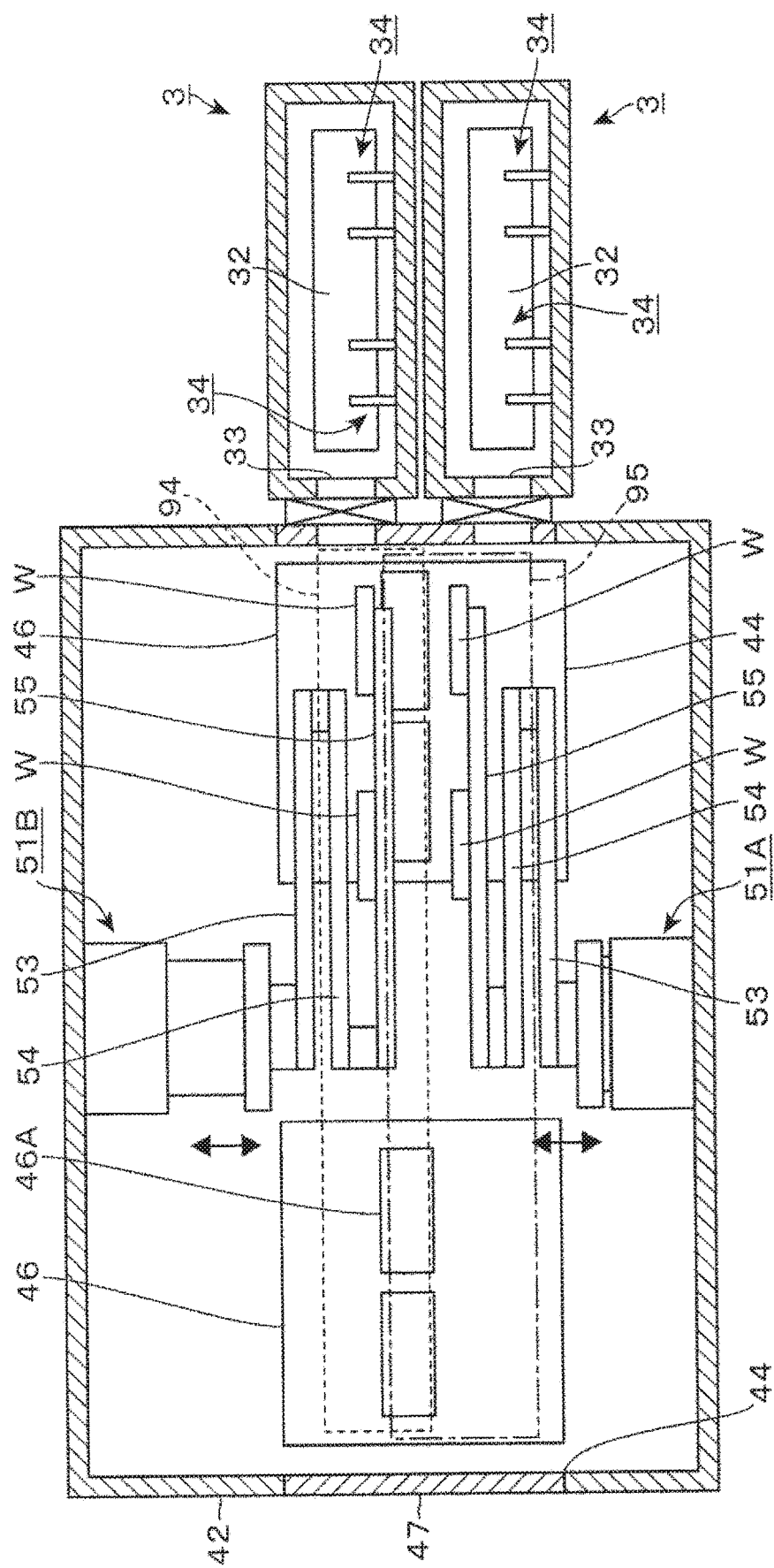
FIG. 12 is a vertical sectional view showing another exemplary configuration of the vacuum transfer module.

FIG. 12 shows another configuration example of the vacuum transfer module 4. The vacuum transfer module 4 shown in FIG. 12 includes an upper and a lower transfer unit 51 for individually transferring the wafer W. A reference numeral 51A denotes the lower transfer unit and a reference numeral 51B denotes the upper transfer unit. The transfer unit 51A is the same as the transfer unit 51 shown in FIG. 2. The transfer unit 51B has an upside-down shape of the transfer unit 51A. A base 52 of the transfer unit 51B is provided at the ceiling of the housing 41 of the vacuum transfer module 4.

The transfer unit 513 transfers the wafer W between the upper load-lock module 3 and the processing module 6. The transfer unit 52A transfers the wafer W between the lower load-lock module 3 and the processing module 6. In other words, the transfer unit 513 transfers the wafer W in an upper region 94 in the housing 41 and the transfer unit 51A transfers the wafer W in a lower region 95 in the housing 41. Since both of the transfer units 51A and 51B transfer the wafers W to the processing modules 6, the lower portion of the upper region 94 and the upper portion of the lower region 95 are overlapped with each other. The vacuum transfer modules 4 of the respective embodiments may include the transfer units 51A and 51B.

The processing module 6 is not limited to a module for forming a film by ALD, and may also be, e.g., a module for forming a film by CVD (Chemical Vapor Deposition) or a module for performing dry etching. When such processes are performed, plasma may not be generated. In the above description, the processing modules 6 perform the same process. However, the processing modules 6 for performing different processes may be connected to the vacuum transfer module 4. In that case, a wafer W may be transferred to one of the processing modules 6 and processed, and then transferred to another processing module 6 and processed, and then returned to the carrier C. For example, one of the processing modules 6 may be a module for forming a film by ALD, and another processing module 6 may be an annealing module for heating the wafer W in a vacuum atmosphere. Further, one of the processing modules and a other processing module 6 may be, e.g., modules for forming different films on the wafer W.

The supporting body 56 of the transfer unit 51 may be shorter than that shown in the drawing, and one wafer W may be supported by one supporting body 56. In other words, the transfer unit 51 may transfer two wafers W at one time. Further, the transfer unit 51 may have one supporting body 56 and transfer two wafers W at one time. In other words, the transfer of four wafers W to the mounting tables 67A and 67B in one processing module 6 may be performed in two steps. The transfer unit 51 does not necessarily transfer a plurality of wafers W, and may transfer only one wafer W. The processing module 6 does not necessarily process four wafers W one time, and may process only one wafer or a plurality of wafers other than four wafers.

The adapters for connecting the load-lock module 3 and the processing modules 6 to the vacuum transfer module 4 do not necessarily have a plate shape, and may have, e.g., a block shape. Further, three or more vacuum transfer modules 4 may connected through plurality of mounting modules 9. In the mounting module 9, the transfer ports 92 for the wafer W of the housing can be opened and closed by the gate valves and the pressure in the housing 91 can be changed, as in the case of the load-lock module 3. In that case, even if the pressures in the vacuum transfer modules 4 connected to each other are different, the wafer W can be transferred between these vacuum transfer modules 4.

The number of the load-lock modules 3 is not limited to two, and may be one. Further, three or more load-lock modules 3 may be provided side by side in the vertical direction. In that case, three or more transfer ports 45A are provided at the interface plate 45 to correspond to the heights of the load-lock modules 3. The processing modules 6 may be provided in multiple stages, as in the case of the load-lock modules 3. The transfer ports 46A may be provided in multiple stages at the interface plate 46.

The housing 41 of the vacuum transfer module 4 may be greater than that in the above example, and two or more openings 44 may be formed side by side in the horizontal direction at the first sidewall 42. Three or more openings 44 may be formed side by side in the horizontal direction at the second sidewall 43. In order to increase a degree of freedom in the layout of the substrate processing apparatus, it is preferable to set the number of the openings 44 formed at the second sidewall 43 to be greater than the number of the openings 44 formed at the first sidewall 42.

As in the case of the substrate processing apparatus 1, the substrate processing apparatuses 83 to 85 may be arranged in a matrix shape. However, the illustrated matrix-shaped arrangement of the substrate processing apparatuses is merely an example, and the number of substrate processing apparatuses and the arrangement of the substrate processing apparatuses may vary. The present disclosure is not limited to the above embodiments, and respective embodiments may be appropriately modified or combined with each other.

In each of the substrate processing apparatuses, it is required to quickly transfer the wafer W between the load-lock module 3 and the carrier C and increase the throughput of the apparatus. The loader module 2 is configured to quickly transfer the wafer W. Hereinafter, the loader module 2 will be described in detail.

Figure 13:
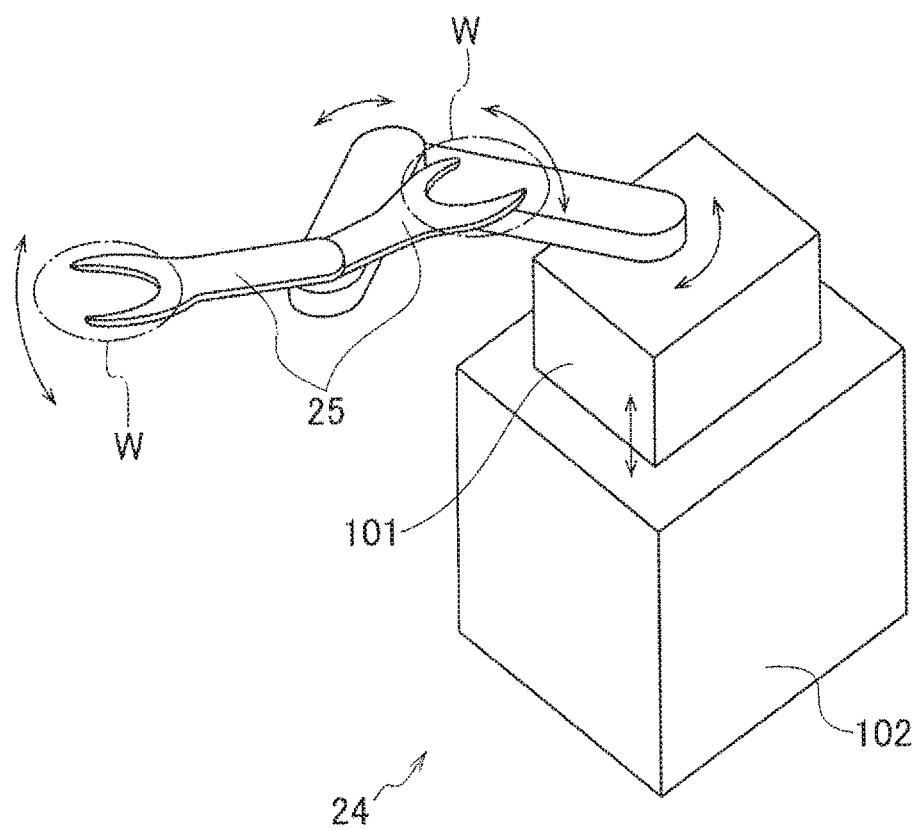
FIG. 13 shows a transfer unit provided at the loader module constituting the substrate processing apparatus.

FIG. 13 is a perspective view showing the transfer unit 24 described with reference to FIG. 1 and the like. The transfer unit 24, which is a substrate transfer unit for the loader module, has a multi-joint arm as described above. Two holding portions 25 forming the leading end portions of the multi-joint arm are arranged in the vertical direction. The two holding portions 25 are independently rotatable and can hold the wafers W as described above. The transfer unit 24 includes a supporting table 101 for supporting the base portion of the multi-joint arm. The supporting table 101 is vertically movable by an elevating mechanism 102. In other words, the holding portions 25 are movable horizontally and vertically. By cooperation of the horizontal movement and the vertical movement, the wafer W can be transferred to the respective components of the apparatus.

Figure 14:
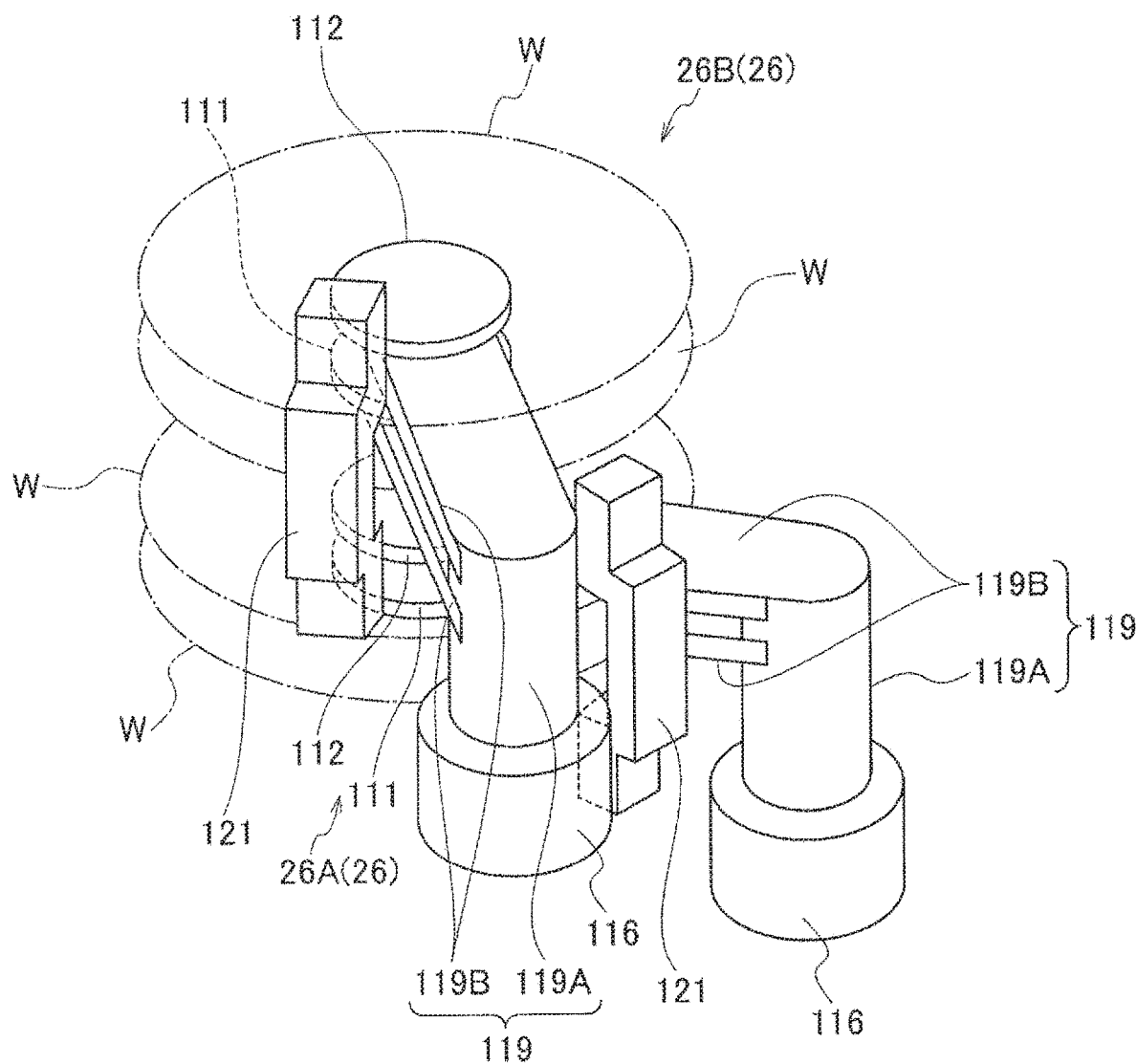
FIG. 14 is a perspective view showing alignment units provided at the loader module.
Figure 15:
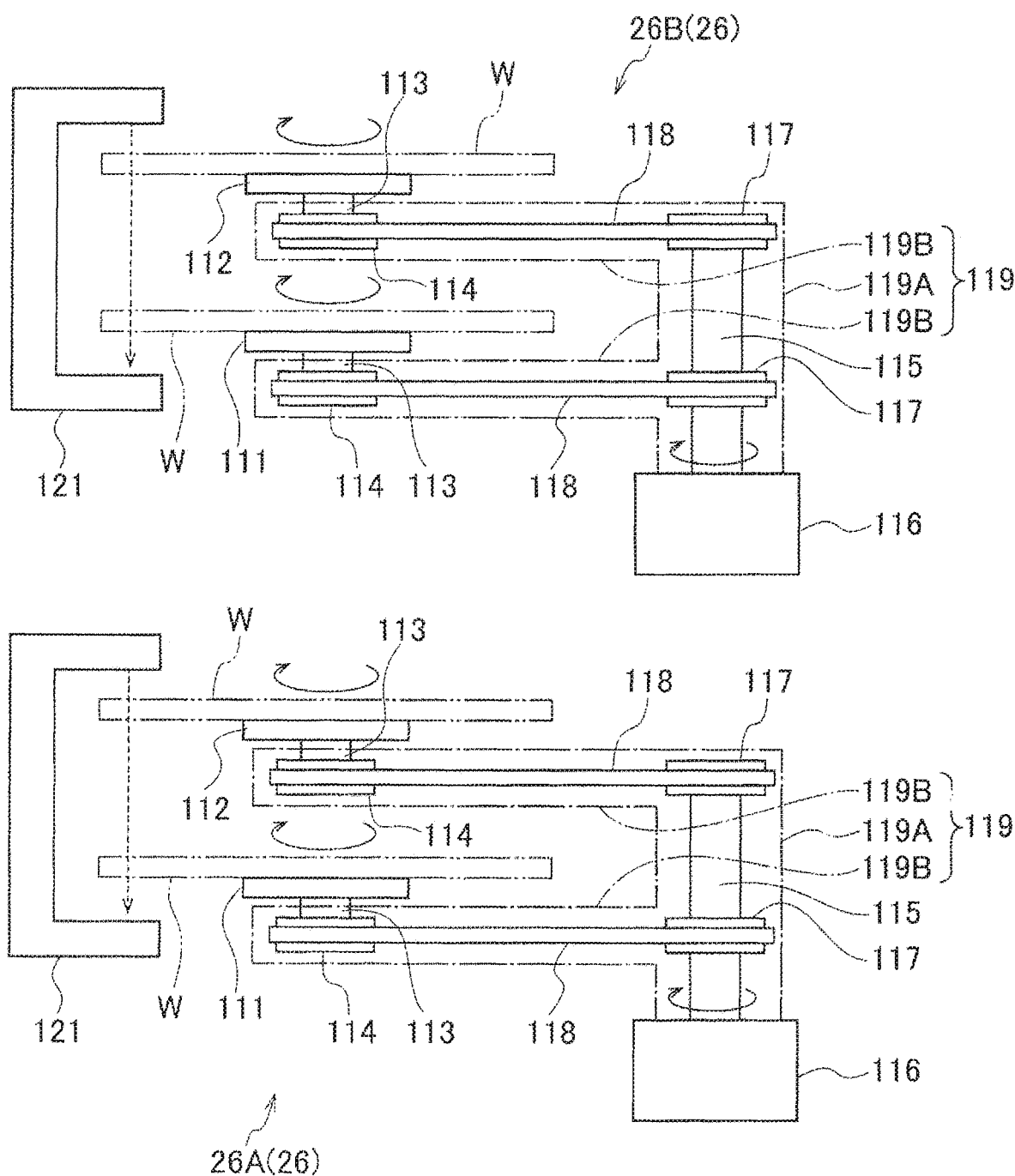
FIG. 15 is a schematic side view showing the alignment units.

Next, two alignment units 26 provided at the loader module will be described with reference to FIGS. 14, 15. FIG. 14 is a perspective view of the alignment units 26. FIG. 15 is a simplified side view showing the configuration of the alignment units 26. As described above, the alignment units 26 are provided in upper and lower two stages. The alignment units 26 constitute a substrate position detection mechanism. Hereinafter, a reference numeral 26A denotes the lower alignment unit and a reference numeral 26B denotes the upper alignment unit. The alignment units 26A and 26B have the same configuration and, thus, the alignment unit 26A will be described representatively. The alignment unit 26A includes flat circular mounting portions 111 and 112 for a wafer W. The mounting portions 111 and 112 are spaced apart from each other in a vertical direction and overlapped with each other when seen from the top. The reference numeral 111 denotes the lower mounting portion and the reference numeral 112 denotes the upper mounting portion.

As shown in FIG. 15, a shaft 113 extends vertically downward from the center portion of each of the mounting portions 111 and 112. A reference numeral 114 in the drawing denotes a pulley. The pulley 114 is provided at a lower portion of the shaft 113 and rotates together with the shaft 113. A shaft 115 extending vertically is, provided at one side of the mounting portions 111 and 112. A lower end of the shaft 115 is connected to a motor 116 that is a rotation mechanism for rotating the shaft 115. A reference numeral 117 in the drawing denotes pulleys provided at an upper and a lower portion of the shaft 115. The pulleys 117 rotate together with the shaft 115. Timing belts 118 are wound around the upper pulleys 114 and 117 and around the lower pulleys 114 and 117. With this configuration, when the shaft 115 rotated by the motor 116, power is transferred by the timing belts 118, and both of mounting portions 111 and 112 rotate about the central axes thereof. A reference numeral 119 denotes a housing. The housing 119 includes a vertical portion 119A extending to surround the shaft 115 and the pulley 117, a horizontal portion 119B extending horizontally in upper and lower two stages from the vertical portion 119A and surrounding the timing belts 118, the shaft 113 and the pulley 114.

The motor 116 is shared by the mounting portions 111 and 112 and provided at one side of the mounting portions 111 and 112. With this configuration, the distance between the mounting portions 111 and 112 can be reduced compared to a configuration in which two motors 116 are respectively provided below the mounting portions 111 and 112 to rotate the mounting portions 111 and 112. Therefore, it is possible to avoid an increase in a required moving distance for the transfer unit 24 to access the mounting portions 111 and 112. Accordingly, the transfer of the wafer W in the loader module 2 which will be described later can be quickly performed.

In the drawing, a reference numeral 121 denotes a light detection unit. The edges of the wafers W mounted on the mounting portions 111 and 112 are positioned between two protruding parts of the light detection unit 121 which protrude laterally. These two protruding parts are configured as a pair of transmission type optical sensor. The upper protruding part serves as a light transmitting portion and the lower protruding part serves as a light receiving portion. The light is irradiated vertically downward from the light transmitting portion to the light receiving portion. The dotted arrows in FIG. 15 indicate the optical path between the light transmitting portion and the light receiving portion.

The light is irradiated during the rotation of the wafer W by the mounting portions 111 and 112. The light receiving portion transmits to the controller 10 a detection signal depending on the intensity of the received light. The controller 10 detects the position of the wafer W. The position of the wafer W includes, e.g., the position of a cutout (notch) formed at the edge of the wafer W and the position of the edge of the wafer W. The position of the wafer W is detected in a state in which the wafer W is mounted on only one of the mounting portions 111 and 112 in the alignment unit 26A. In the alignment unit 26B as well, the position of the wafer W is detected in a state where the wafer W is mounted on only one of the mounting portions 111 and 112. In the following description of the operation of the transfer unit 24, the wafers W whose position has been detected are transferred to a predetermined position on the holding, portions 25 in a state where the notches are oriented in a predetermined orientation by the rotation of the mounting portions 111 and 112.

As shown in FIG. 14, the mounting portions 111 and 112 of the alignment unit 26A and the mounting portions 111 and 112 of the alignment unit 26B are overlapped each other when seen from the top. The shaft 115 and the motor 116 of the alignment unit 26A and the shaft 115 and the motor 116 of alignment unit 26B are displaced from each other in the rotation direction of the wafer W. With this arrangement, it is possible to avoid an increase in the distance between the mounting portions 111 and 112 of the alignment unit 26A and the mounting portions 111 and 112 of the alignment unit 26B. Accordingly, it is possible to a d an increase in a required moving, distance for the transfer unit 24 to access the alignment units 26A and 26B, and the transfer of the wafer W in the loader module 2 which will be described later can be quickly performed.

Next, the transfer of the wafer W in the loader module 2 of the substrate processing apparatus 1 will be described in detail with reference to FIGS. 16 to 28 showing the operation of the transfer unit 24. In FIGS. 16 to 28, the wafer W whose position has been detected in the alignment units 26A and 26B and has not yet been processed by the processing module 6 is indicated by dots, and the wafer W that has been processed in the processing module 6 is indicated by hatching. Dots and hatching are not given to wafers W whose positions have not been detected in the alignment units 26A and 26B.

Figure 29:
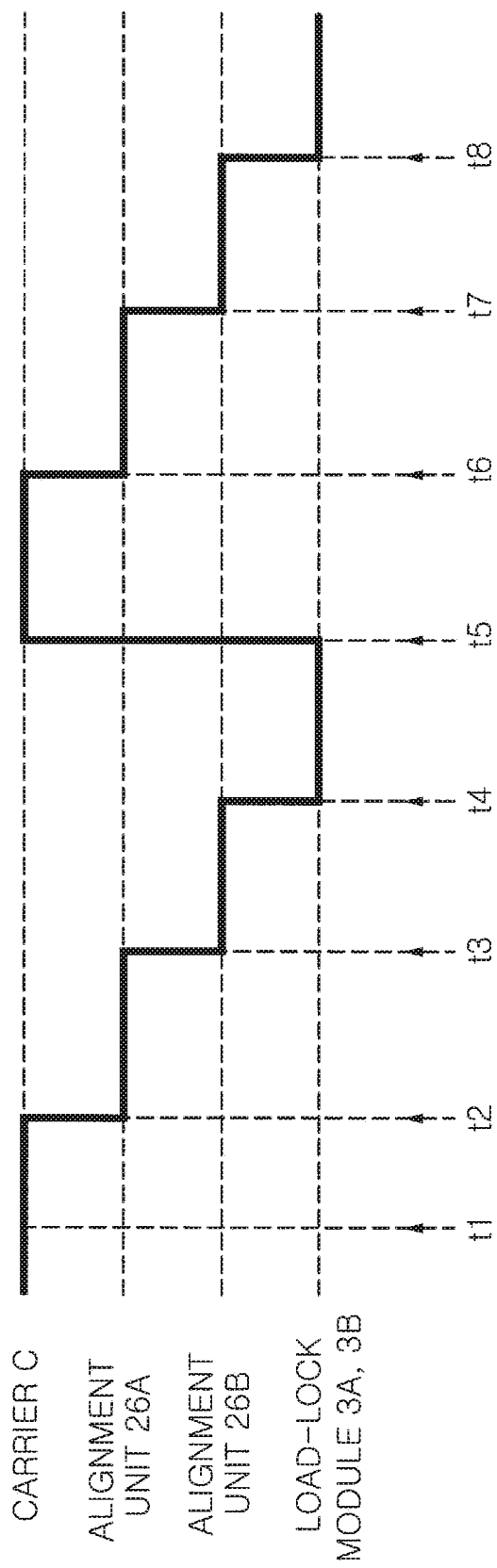
FIG. 29 is a timing chart showing an access destination of the transfer unit.

In the following description, a reference numeral 3A denotes the lower load-lock module and a reference numeral 3B denotes the upper load-lock module. The load-lock module 3A transfers the wafer W to the vacuum transfer module 4, and the load-lock module 3B transfers the wafer W to the loader module 2. As described above, the four supporting portions 34 provided in the load-lock modules 3A and 3B are arranged side by side in the horizontal direction to transfer the wafers W to the vacuum transfer module 4. However, in FIGS. 22 and 24 and the like, the supporting 34 are arranged side by side in the vertical direction, for convenience of illustration. The timing chart of FIG. 29 will be appropriately referred to. The timing chart shows temporal changes of the target accessed by the transfer unit 24.

Figure 16:
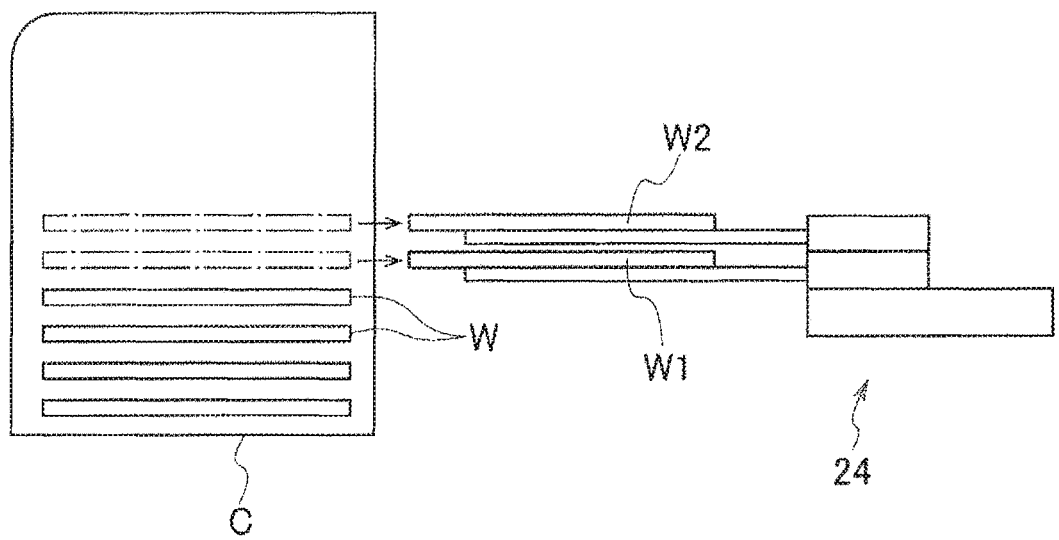
FIGS. 16 to 28 are process diagrams showing transfer of wafers W in the loader module.
Figure 17:
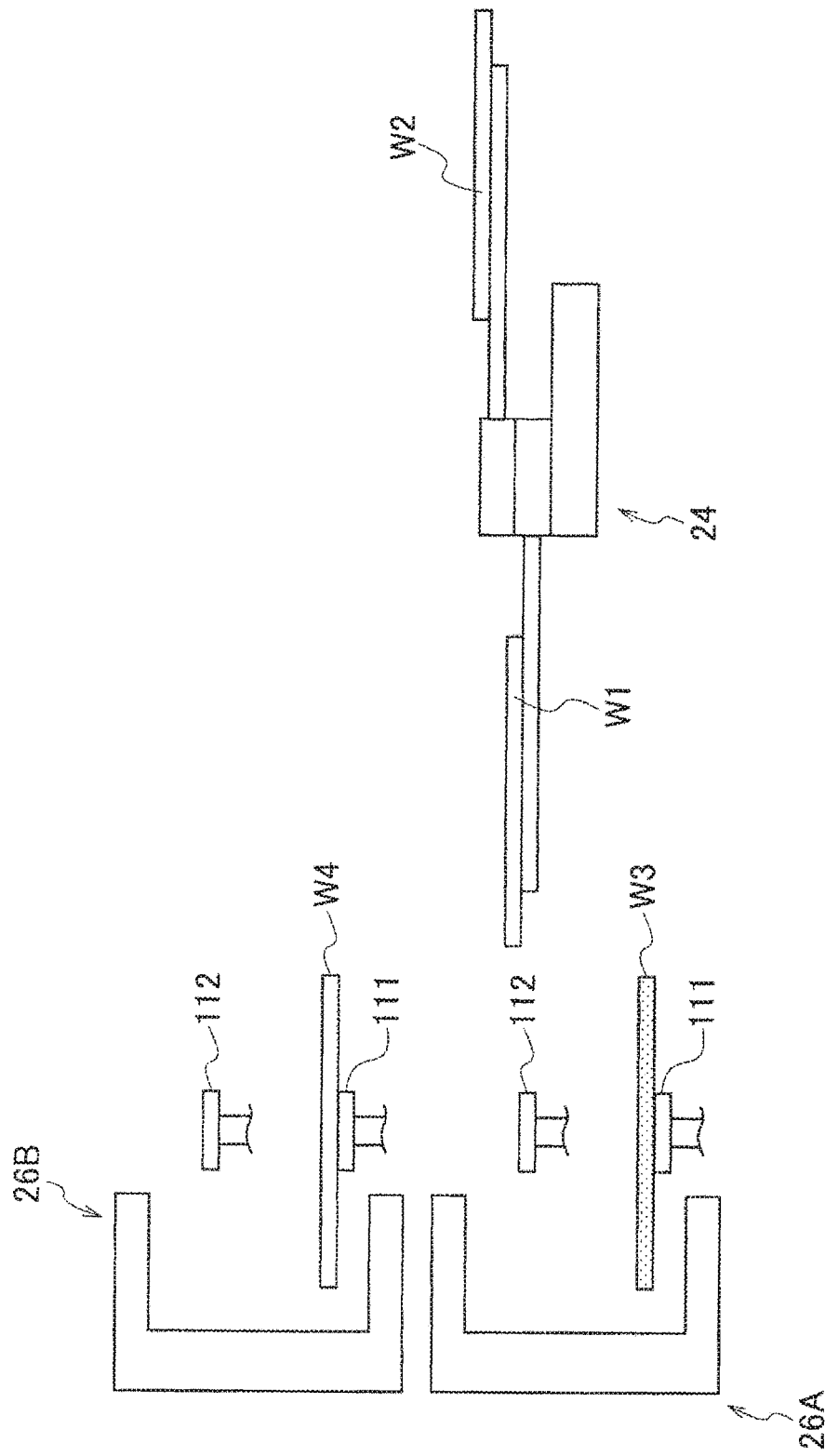
Figure 18:
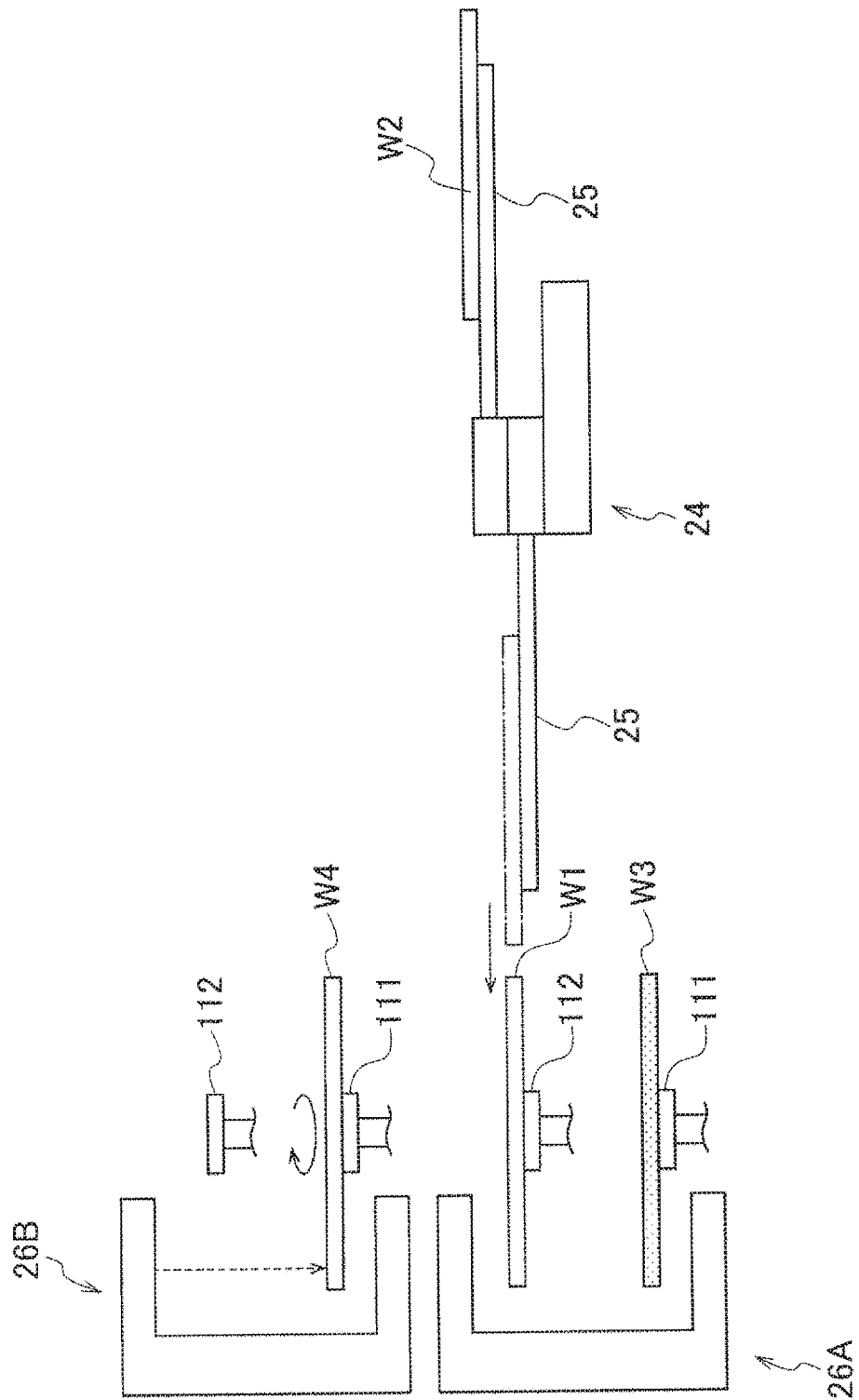
Figure 19:
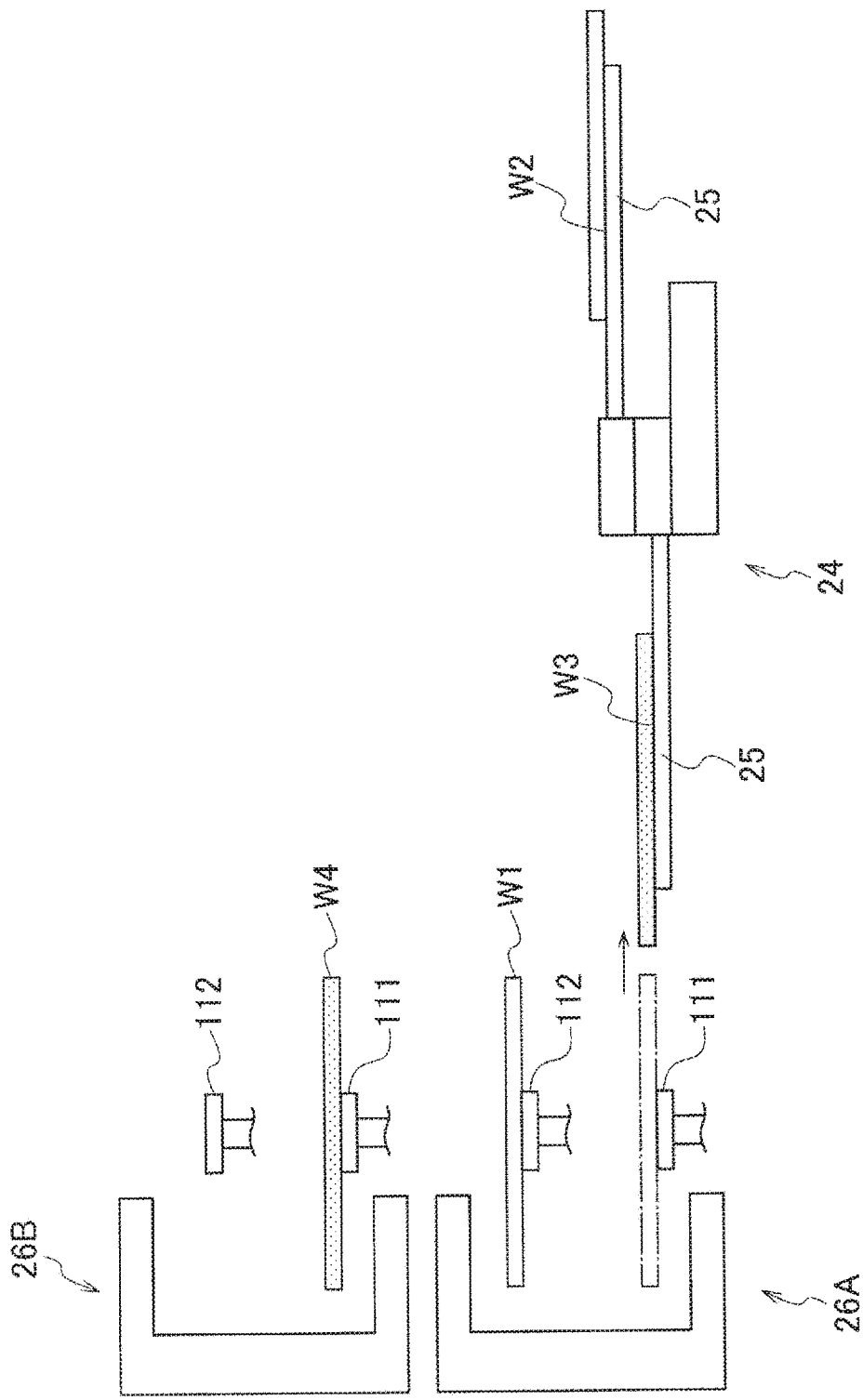

The explanation will be started from the stage where wafers W are newly taken out from the carrier C after wafers W have been taken out from the carrier C multiple times. First, two wafers W (referred to as wafers W1 and W2, for convenience of explanation) are taken out at one time from the carrier C by the transfer unit 24 (FIG. 16, time t1). At this time, in the alignment unit 26A, the wafer W whose position has been detected (referred to as wafer W3 for convenience of explanation) is mounted only on the mounting portion 111 between the mounting portions 111 and 112. In the alignment unit 26B, the wafer W whose position has not been detected (referred to as wafer W4 for convenience of explanation) is mounted only on the mounting portion 111 between the mounting portions 111 and 112 (FIG. 17). The wafer W1 is transferred to the mounting portion 112 of the alignment unit 26A; one of the holding portions 25 of the transfer unit 24 becomes empty (a state in which the wafer W is not held); and in the alignment unit 26B, the position of the wafer W4 is detected (FIG. 18, time t2 in the chart). After the position of the wafer W4 is detected, the wafer W3 whose position has been detected in the alignment unit 26A is received by the empty holding portion 25 (FIG. 19).

Figure 20:
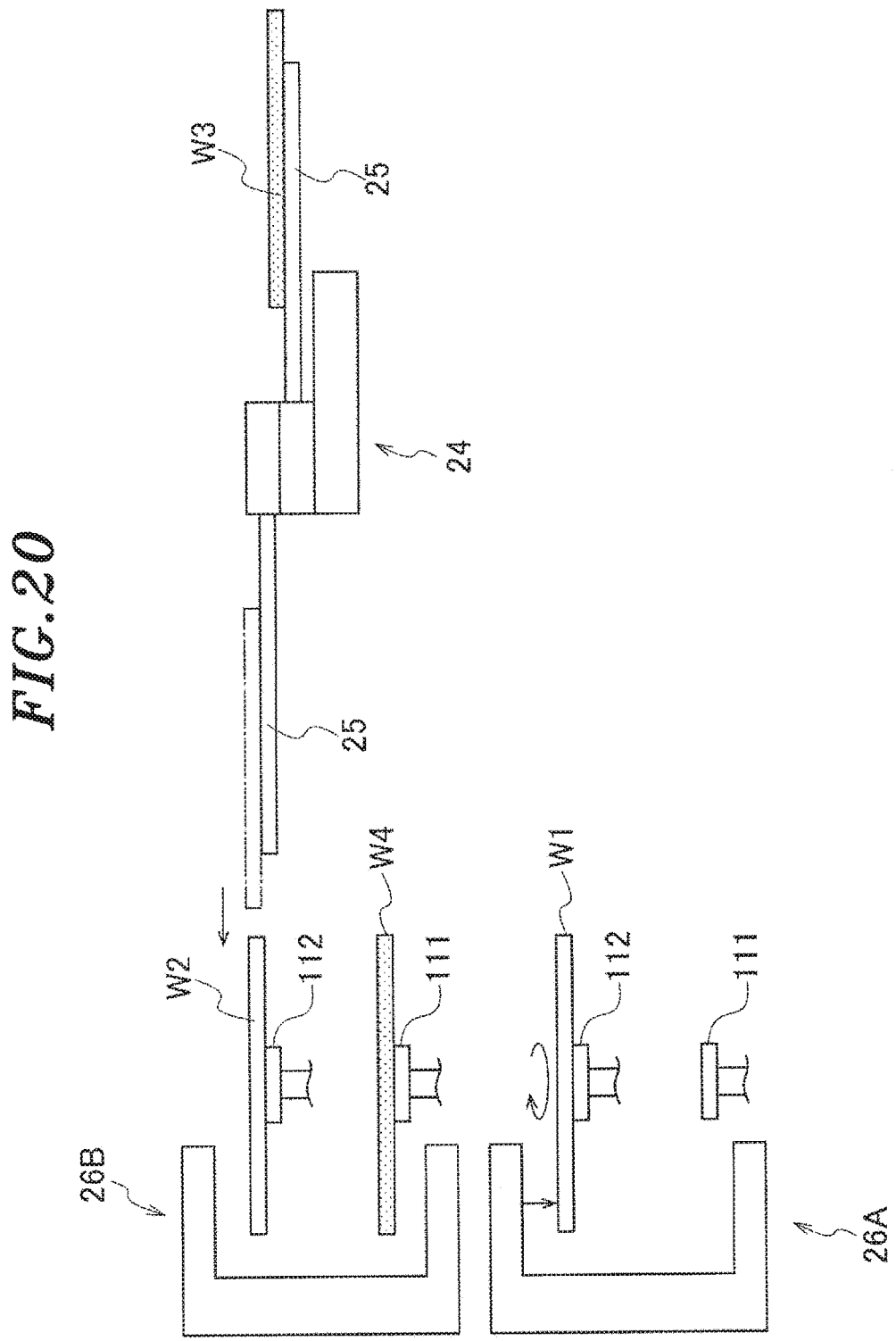

Next, the wafer W2 is transferred to the mounting portion 112 of the alignment unit 26B by the transfer unit 24; one of the holding portions 25 of the transfer unit 24 becomes empty; and the position of the wafer W1 is detected in the alignment unit 26A (FIG. 20, time t3 in chart). After the position of the wafer W1 is detected, the wafer W4 whose position has been detected in the alignment unit 26B is received by the empty holding portion 25 (FIG. 21).

Figure 22:
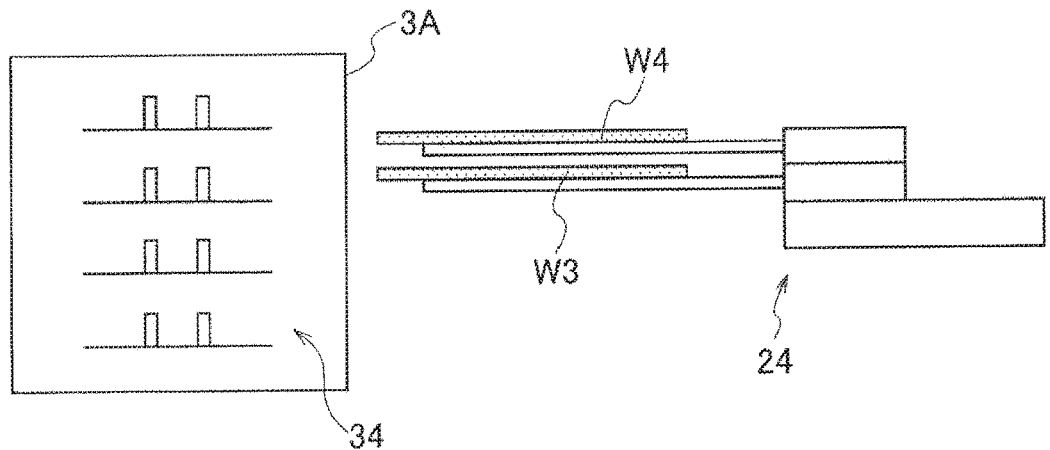
Figure 23:
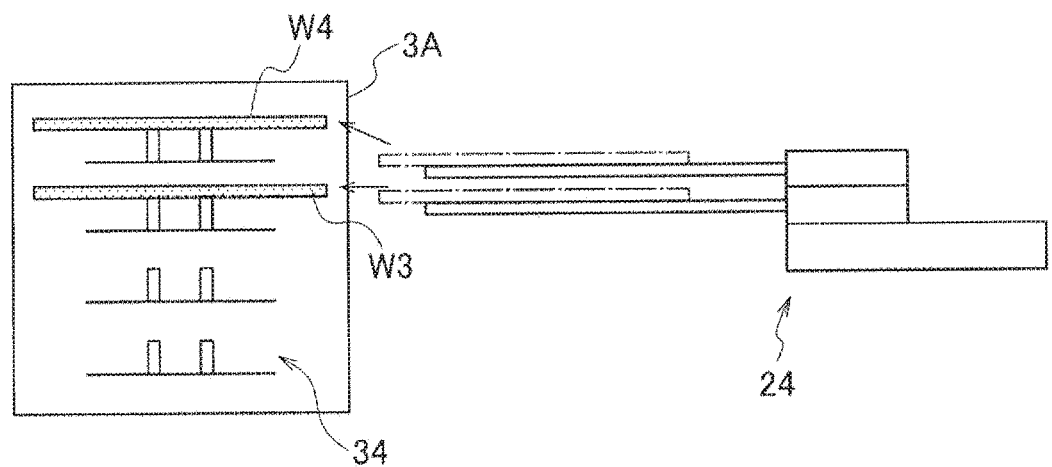
Figure 24:
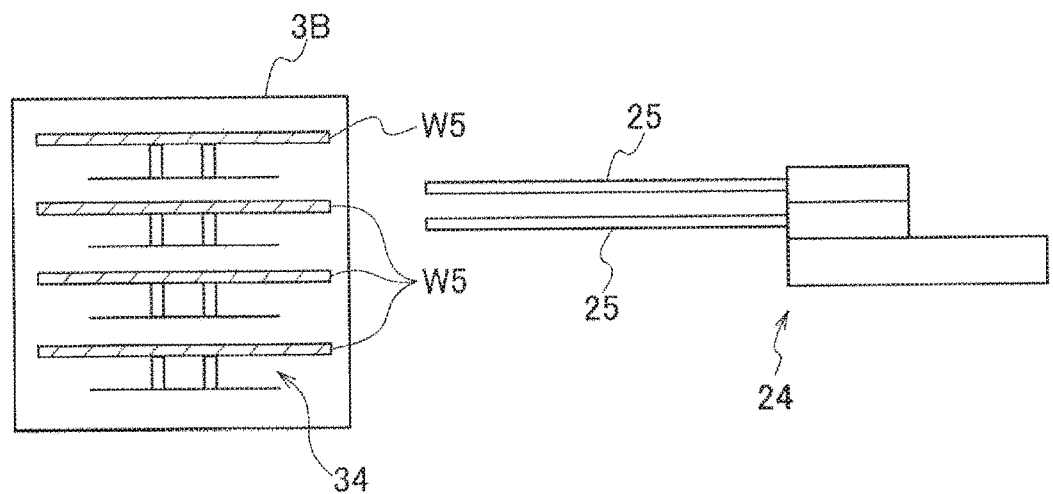
Figure 25:
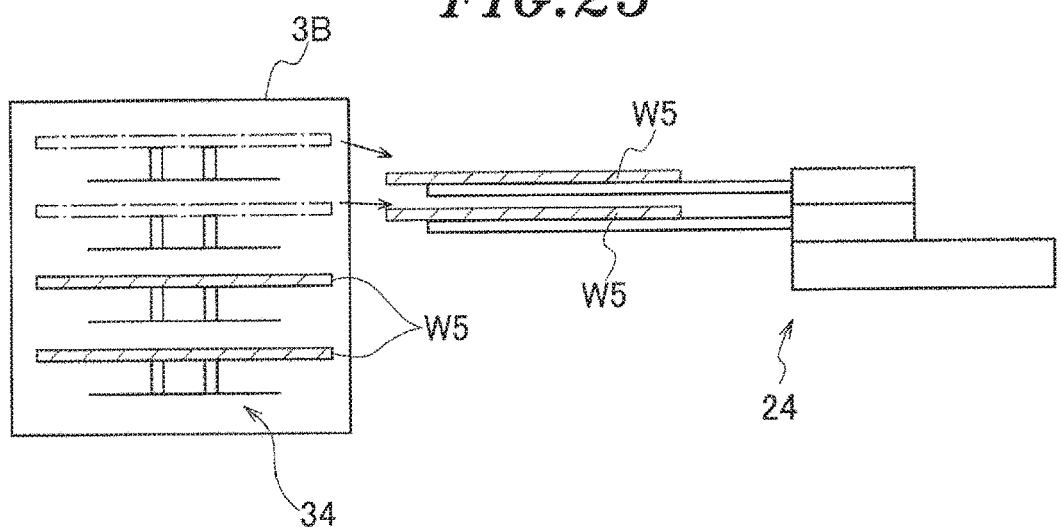
Figure 26:
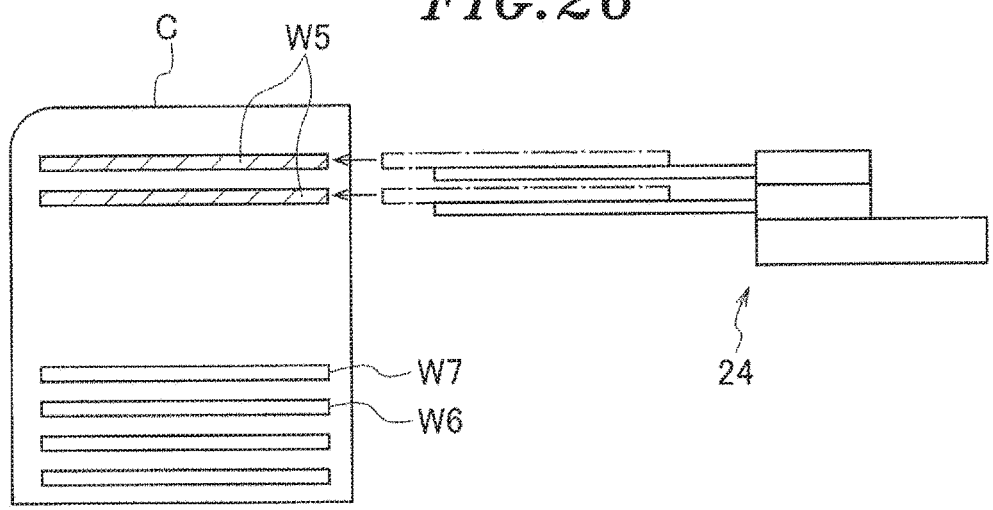

Then, the transfer unit 24 transfers the wafers W3 and W4 to two supporting portions among the four supporting portions 34 of the load-lock module 3A, and the two holding portions 25 of the transfer unit 24 become empty (FIGS. 22 and 23, time t4). During the transfer of the wafers W3 and W4, the position of the wafer W2 is detected in the alignment unit 26B. Next, two wafers W among the processed wafers (referred to as wafers W5) held on the four supporting portions 34 in the load-lock module 3B are held on the empty holding portions 25 (FIGS. 24 and 25) and transferred to the carrier C by the transfer unit 24 (FIG. 26, time t5)

Then, the transfer of the wafer W by the transfer unit 24 in the order of the carrier C→the alignment unit 26A→the alignment unit 26B→the load-lock module 3A she load-lock module 3B→the carrier C which corresponds to a series of operations from the time t1 to the time t5 is performed again. Hereinafter, a next transfer cycle of the above transfer cycle of the wafer W from the time t1 to the time t5 will be described briefly. First, two wafers N (referred to as wafers W6 and W7 in FIG. 26) are taken out from the carrier C and transferred at one time by the transfer unit 24.

Figure 21:
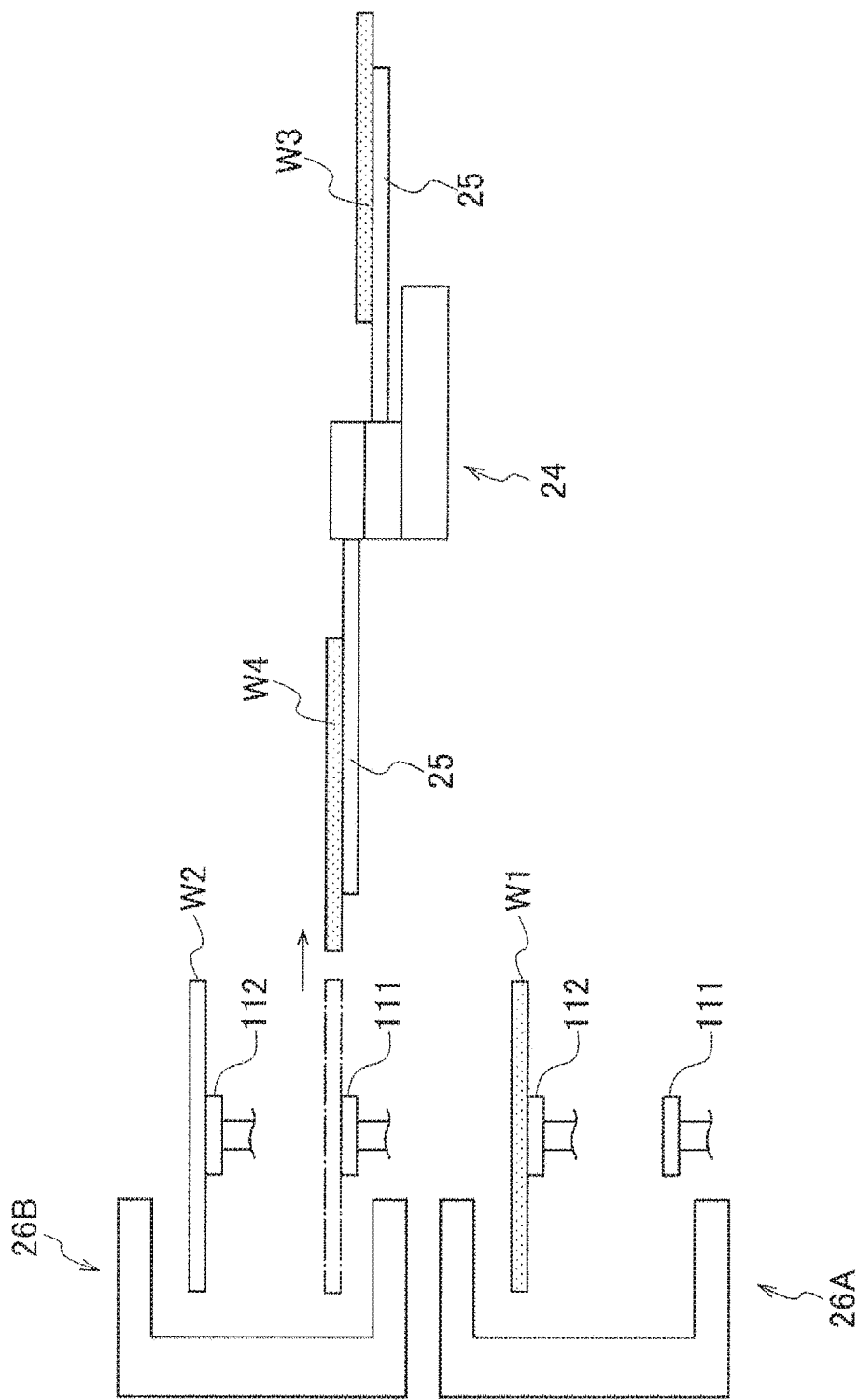
Figure 27:
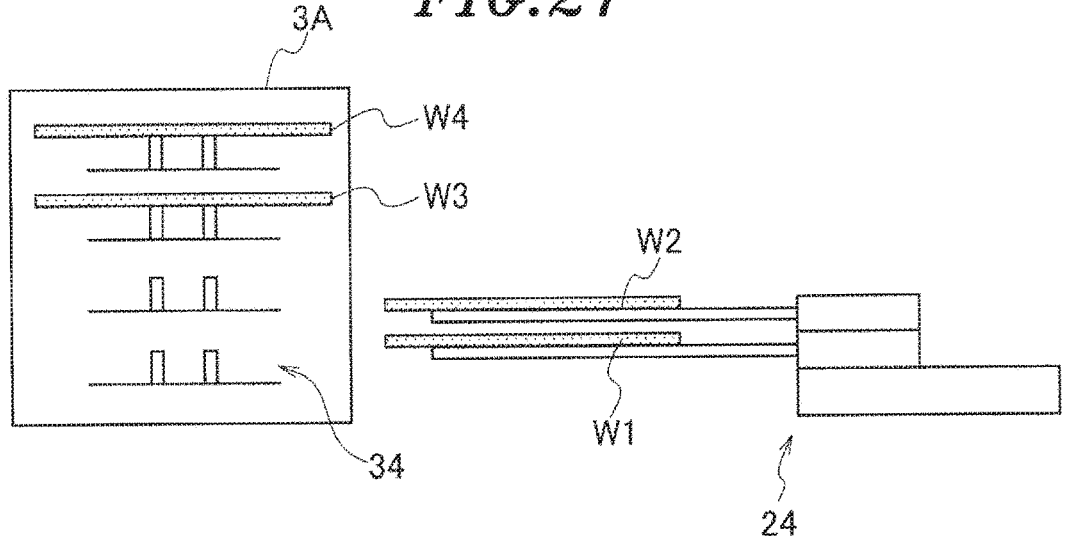
Figure 28:
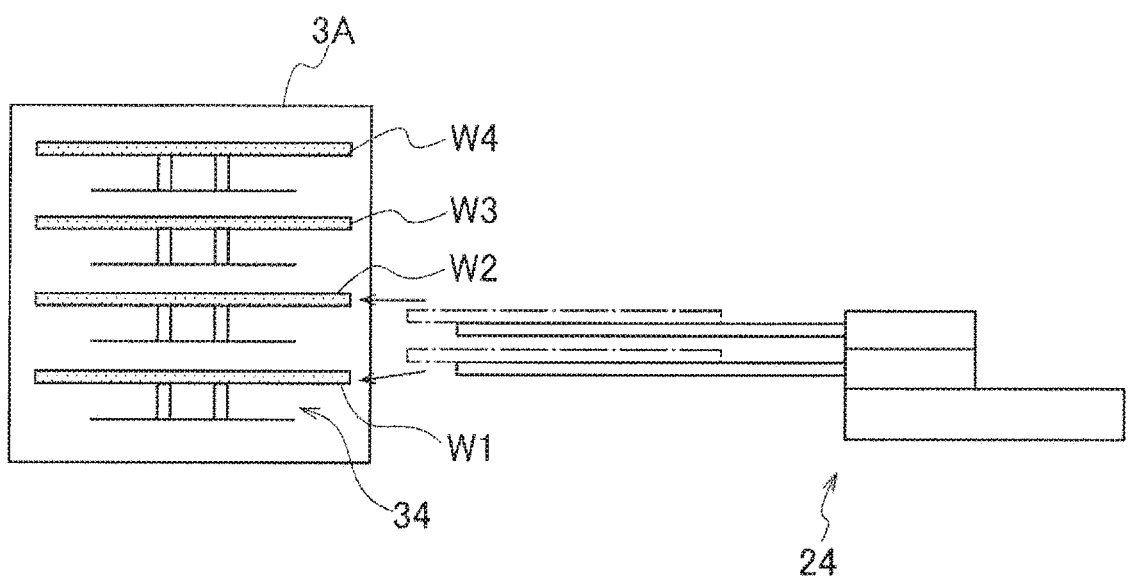

At this time, in the alignment units 26A and 26B, the mounting portions 111 are empty as shown in FIG. 21. Thus, the transfer unit 24 transfers the wafer W6 to the mounting portion 111 of the alignment unit 26A (time t6) and the wafer W1 whose position has been detected in the alignment unit 26A is received by the empty holding portion 25. In other words, the same operations as those described with reference to FIGS. 17 to 19 are performed except that the wafer W is transferred to the mounting portion 111 and the wafer W is received from the mounting portion 112. Next, the transfer unit 24 transfers the wafer W7 to the mounting portion 111 of the alignment unit 26B (time t7) and the wafer W2 whose position has been detected in the alignment unit 26B is received by the empty holding portion 25. In other words, the same operations as those described with reference to FIGS. 20 and 21 are performed except that the wafer W is transferred to the mounting portion 111 and the wafer W is received from the mounting portion 112. In the alignment units 26A and 26B, the position of the wafers W6 and W7 are detected. The transfer unit 24 transfers the received wafers W1 and W2 to the load-lock module 3A at one time and delivers them to two empty supporting portions 34 (FIGS. 27 and 28, time t8).

Next, the transfer unit 51 of the vacuum transfer module 4 accesses the load-lock module 3A as described above and transfers the wafers W1 to W4 to the vacuum transfer module 4 at one time. The transfer unit 24 that has transferred the wafers W1 and W2 to the load-lock module 3A receives the other two wafers W5 (see FIG. 25) held on the supporting portions 34 of the load-lock module 3B and transfers them to the carrier C at one time.

As described above, the loader module 2 is provided with the alignment units 26A and 26B, each having the mounting portions 111 and 112, and the positions of the wafers W mounted on the mounting portions 111 and 112 can be detected in each of the alignment units 26A and 26B. In the case of transferring the wafers W taken out from the carrier C to the alignment units 26A and 26B by the transfer unit 24, the transfer of the wafers W is controlled such that one of the mounting portions 111 and 112 of the same alignment unit allows the wafer W whose position has been detected to stand by and the other mounting portion becomes empty so that the wafer W taken out from the carrier C can be mounted thereon. More specifically, the wafer W is mounted on one of the mounting portions 111 and 112 during one transfer cycle. In a next transfer cycle, the wafer W is mounted on the other one of the mounting portions 111 and 112, and the wafer W mounted on the mounting portion 111 or 112 in the previous transfer cycle is transferred to the load-lock module 3A. In other words, the wafers W are alternately sequentially transferred to the mounting portions 111 and 112 of the same alignment unit and alternately sequentially transferred to the load-lock module 3A.

By transferring the wafers W to the mounting portions 111 and 112 as described above, the wafers W can be exchanged between the alignment unit 26A or 26B and the transfer unit 24 by using the empty mounting portion between the mounting portions 111 and 112 even if the holding port on 25 of the transfer unit 24 is not empty. Therefore, the transfer unit 24 can take out two wafers W from the carrier C and transfer them to the alignment units 26A and 26B at one time. Accordingly, the frequency of accesses to the carrier C by the transfer unit 24 to take out wafers W can be reduced, which makes it possible to improve the throughput of the substrate processing apparatus 1.

In the transfer example shown in the drawings, the wafer W5 is transferred from the load-lock module 3 to the carrier C between the transfer of the wafers and W4 from the alignment units 26A and 26B to the load-lock module 3A and the transfer of the wafers W1 and W2 to the load-lock module 3A. However, it is also possible to transfer the wafers W1 and W2 to the load-lock module 3A and then transfer the wafer W5 from the load-lock module 3B to the carrier C. In other words, the operation of the transfer unit 24 may be controlled such that the transfer of four wafers W to the load-lock module 3A through the alignment units 26A and 26B and the transfer of four wafers W from the load-lock module 3B to the carrier C can be alternately performed. As can be seen from the drawings, it is more efficient to transfer the wafers W to the load-lock module 3B and then transfer the wafers W from the load-lock module 3B to the carrier C.

Figure 30:
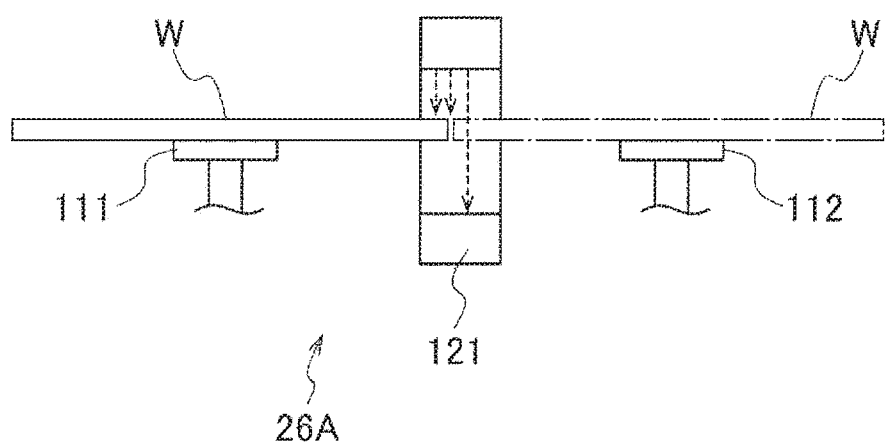
FIG. 30 schematically shows another configuration of the alignment unit.

As shown in FIG. 30, the mounting portions 111 and 112 of the alignment unit 26A or 26B are arranged in the horizontal direction and the light detection unit 121 has a comparatively long width along the arrangement direction of the mounting portions 111 and 112. The positions of the wafers W mounted on the mounting portions 111 and 112 may be detected by irradiating light downward to form an optical path passing through the gap between the mounting portions 111 and 112. Dashed arrows in FIG. 30 indicate the optical path. When the floor area occupied by the alignment units 26A and 26B is increased, restrictions on the arrangement positions of the alignment units 26A and 26B are increased. Further, when the width of the optical path is increased, the optical path may be affected by external factors. Therefore, it is preferable to arrange the mounting portions 111 and 112 in upper and lower two stages as described above.

The transfer unit 24 may have three or more holding portions 25 and take out three or more wafers W from the carrier C and transfer them at one time. For example, the transfer unit 24 has three holding portions (for convenience, referred to as holding portions 25A to 25C) and transfer wafers W whose positions have not been detected to the alignment units 26A and 26B. First, the wafers W are exchanged between the alignment unit 26A and the holding unit 25A so that the alignment unit 26A holds the wafer W whose position has not been detected and starts the position detection thereof and the holding portion 25A holds the wafer W whose position has been detected.

Then, the wafers W are exchanged between the alignment unit 26B and the holding portion 25B so that the alignment unit 26B holds the wafer W whose position has not been detected and the holding port on 25B holds the wafer W whose position has been detected. Further, the wafers W are exchanged between the alignment unit 26A and the holding portion 25C so that the alignment unit 26A holds the wafer W whose position has not been detected and the holding portion 25C holds the wafer W whose position has been detected. The wafer W held by the holding portion 25C was held the holding portion 25A before the position detection. The holding portions 25A to 25C transfer the wafers W whose position have been detected to the load-lock module 3A. Therefore, the number of the holding portions 25 of the transfer unit and the number of the alignment units may be the same or may be different. The number of the alignment units may be three or more.

While the operation of the loader module 2 of the substrate processing apparatus 1 has been described, the loader modules 2 of other apparatuses can also transfer the wafer W in the same manner. The transfer method of the wafer W or the configuration of the loader module 2 is not limited to the above example and may be changed appropriately.

While the present disclosure has been shown and described with respect to the embodiments, it will be understood by those skilled in the art that various changes and modifications may be made without departing from the scope of the present disclosure as defined in the following claims.

What is claimed is:

1. A vacuum transfer module, to which a load-lock module and a plurality of processing modules for processing a substrate in a vacuum atmosphere are connected, the vacuum transfer module comprising:
    a housing in which a vacuum atmosphere is generated;
    a substrate transfer unit for transferring the substrate between the load-lock module and the plurality of processing modules,
    a first adaptor for connecting the load-lock module and a second adaptor for connecting the plurality of processing modules; and
    a plurality of adaptor attaching portions, to which one of the first adaptor and the second adaptor is attached, provided at a sidewall of the housing, the plurality of adaptor attaching portions being common for the first adaptor and the second adaptor,
    wherein the first and the second adaptors include plate-shaped members and through-holes defining transfer ports are formed in each of the plate-shaped members, and
    wherein an arrangement of the through-holes within the plate-shaped member of the first adaptor and an arrangement of the through-holes within the plate-shaped member of the second adaptor are different from each other.

2. The vacuum transfer module of claim 1, wherein the housing has a rectangular shape when seen from above; a first set of the plurality of adaptor attaching portions are provided at each of short sides of the rectangular shape; a second set of the plurality of adaptor attaching portions are provided at each of long sides of the rectangular shape; the number of the second set provided at each of long sides is larger than the number of the first set provided at each of the short sides; and the adaptor attaching portions are symmetrically arranged in a back-and-forth direction and in a right-left direction when seen from above.

3. The vacuum transfer module of claim 1, wherein at least one of the plurality of adaptor attaching portions provided at the vacuum transfer module, to which both of the first adaptor and the second adaptor are not attached, is airtightly closed by a blocking member.

4. The vacuum transfer module of claim 1, wherein the first adaptor and the second adaptor are transfer path defining members which form a transfer path for the substrate.

5. The vacuum transfer module of claim 1, wherein the substrate transfer unit includes a plurality of substrate transfer units, and the substrate is independently transferred in an upper region and a lower region in the housing.

6. The vacuum transfer module of claim 1, wherein each of the plurality of processing modules is configured such that two substrates arranged in a right-left direction are arranged in two rows in a back-and-forth direction when seen from a substrate transfer port of the processing module, and
    the substrate transfer unit is configured to transfer two or four substrates at one time in accordance with an arrangement of the substrates in the processing module.

7. The vacuum transfer module of claim 1, wherein the vacuum transfer module further comprises gate valves for opening and closing the transfer ports.

8. A substrate processing apparatus comprising:
    a vacuum transfer module, to which a load-lock module and a plurality of processing modules for processing a substrate in a vacuum atmosphere are connected, the vacuum transfer module comprising:
        a housing in which a vacuum atmosphere is generated;
        a substrate transfer unit for transferring the substrate between the load-lock module and the plurality of processing modules;
        a first adaptor for connecting the load-lock module and a second adaptor for connecting the plurality of processing modules; and
        a plurality of adaptor attaching portions, to which one of the first adaptor and the second adaptor is attached, provided at a sidewall of the housing, the plurality of adaptor attaching portions being common for the first adaptor and the second adaptor,
    wherein the first and the second adaptors include plate-shaped members and through-holes defining transfer ports are formed in each of the plate-shaped members, and
    wherein an arrangement of the through-holes within the plate-shaped member of the first adaptor and an arrangement of the through-holes within the plate-shaped member of the second adaptor are different from each other, the load-lock module;

the plurality of processing modules; and a loader module, to which a transfer container where the substrate is stored is mounted, configured to transfer the substrate between the transfer container and the load-lock module.

9. The substrate processing apparatus of claim 8, wherein the load-lock module and the vacuum transfer module are arranged in a back-and-forth direction and the load-lock module and the loader module are arranged in a right-left direction when viewed from a location above the substrate processing apparatus.

10. The substrate processing apparatus of claim 9, wherein the loader module is provided at both sides of the load-lock module in the right-left direction.

11. The substrate processing apparatus of claim 9, wherein the loader module and at least one of the processing modules form a row in the back-and-forth direction.

12. The substrate processing apparatus of claim 8, wherein the vacuum transfer module includes a plurality of vacuum transfer modules, and wherein the first adaptor, the second adaptor and a blocking member are not attached to one of the adaptor attaching portions of one vacuum transfer module and one of the adaptor attaching portions of another vacuum transfer module, and a mounting module, in which the substrate to be transferred between said one vacuum transfer module and said another vacuum transfer module is mounted, is provided between said one of the adaptor attaching portions of said one vacuum transfer module and said one of the adaptor attaching portions of said another vacuum transfer module.

13. The substrate processing apparatus of claim 8, wherein the loader module includes:

a plurality of mounting portions on which substrates are mounted, a sensor commonly used for the plurality of mounting portions to detect positions of the substrates mounted on the plurality of mounting portions; and a substrate transfer unit, for the loader module, configured to transfer a substrate whose position has been detected to the load-lock module.

14. The substrate processing apparatus of claim 13, wherein the plurality of mounting portions and the sensor form a plurality of position detection units; and the substrate transfer unit for the loader module transfers a plurality of substrates at one time from the transfer container to the plurality of position detection units, and transfers one of the plurality of substrates to the mounting portion forming one position detection unit and another one of the plurality of substrates to the mounting portion forming another position detection unit.

15. The substrate processing apparatus of claim 8 wherein the vacuum transfer module further comprises gate valves for opening and closing the transfer ports.

* * * * *